United States Patent [19]
Arbel

[11] Patent Number: 5,623,228
[45] Date of Patent: *Apr. 22, 1997

[54] NON-LINEAR FEEDBACK NETWORK PROVIDING A LINEAR TRANSFER FUNCTION

[75] Inventor: Arieh Arbel, Haifa, Israel

[73] Assignee: Dan Inbar, Haifa, Israel

[*] Notice: The term of this patent shall not extend beyond the expiration date of Pat. No. 5,410,271.

[21] Appl. No.: 423,442

[22] Filed: Apr. 19, 1995

Related U.S. Application Data

[63] Continuation-in-part of Ser. No. 61,559, May 17, 1993, Pat. No. 5,410,271.
[51] Int. Cl.$^6$ ............................................. H03F 1/34
[52] U.S. Cl. ................ 330/110; 330/282; 330/284; 333/81 R
[58] Field of Search .......................... 330/86, 110, 145, 330/282, 284; 332/174, 176, 177; 333/81 R

[56] References Cited

U.S. PATENT DOCUMENTS

| | | | |
|---|---|---|---|
| 3,539,826 | 11/1970 | Crouse | 330/145 X |
| 4,422,051 | 12/1983 | Katakura et al. | |
| 4,454,478 | 6/1984 | Yokoyama | |
| 4,551,685 | 11/1985 | Kerns, Jr. et al. | 330/282 |
| 4,791,385 | 12/1988 | Wermuth | 330/284 X |
| 4,902,982 | 2/1990 | Moore et al. | |
| 5,180,988 | 1/1993 | McDaniel | 330/86 X |
| 5,210,503 | 5/1993 | Sawamura | 330/110 |
| 5,256,986 | 10/1993 | Flocke et al. | |

FOREIGN PATENT DOCUMENTS

| | | | |
|---|---|---|---|
| 137110 | 7/1985 | Japan | 330/282 |
| 3099505 | 4/1991 | Japan | |
| 4117710 | 4/1992 | Japan | |
| 4274607 | 9/1992 | Japan | |
| 2107948 | 5/1983 | United Kingdom | |

OTHER PUBLICATIONS

Arbel, Arie F., "Analog Signal Processing and Instrumentation," 1980, pp. 3–5, 29–31.
Arbel, Arie F., "Output for Current-Mode Feedback Amplifiers, Theory and Applications," 1992, pp. 243–255.

Primary Examiner—James B. Mullins
Attorney, Agent, or Firm—Greenblum & Bernstein, P.L.C.

[57] ABSTRACT

An electronic circuit incorporating an operational amplifier and a feedback network consisting substantially of a plurality, N+M, of substantially identical non-linear elements connected in parallel in two groups of N and M elements each to provide a linear feedback stabilized gain or attenuation.

53 Claims, 20 Drawing Sheets

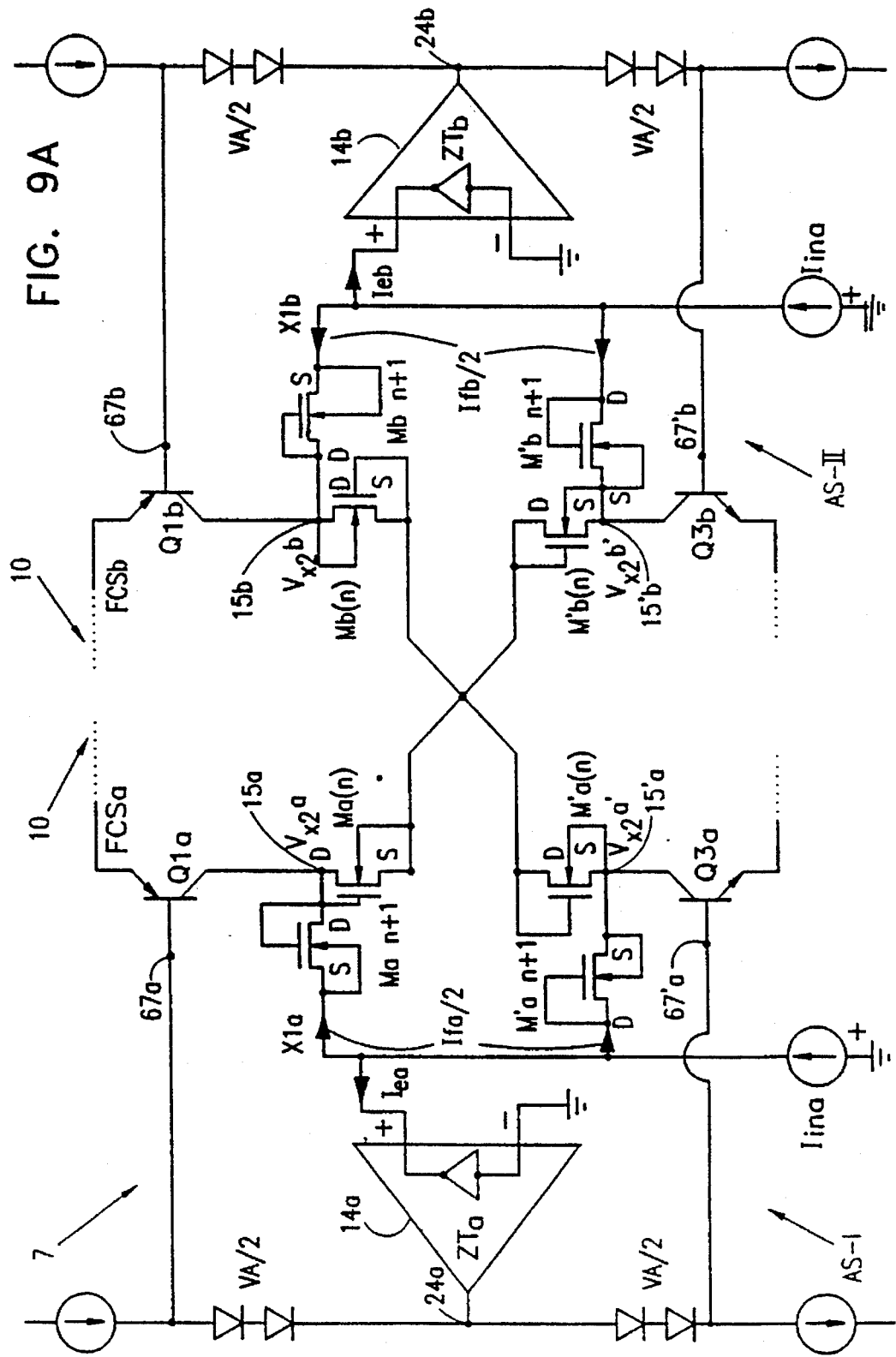

NON-LINEAR FEEDBACK NETWORK PROVIDING A LINEAR TRANSFER FUNCTION

RELATED APPLICATION

This application is a continuation in part of U.S. patent application Ser. No. 08/061,559, filed May 17, 1993, now U.S. Pat. No. 5,410,271.

FIELD OF THE INVENTION

The present invention pertains generally to feedback networks employed to stabilize the gain of linear operational amplifiers and to linear attenuators, and more particularly to integrated circuit (IC) type current mode linear operational amplifiers.

BACKGROUND OF THE INVENTION

Gain control plays an important role in analog signal processing (ASP). Gain control can be achieved either by placing a variable attenuator in front of an operational amplifier (op-amp) or by changing the resistance of its feedback network. For higher signal to noise ratios (SNR) it is preferable to control the gain by varying the attenuation of the feedback network of the operational amplifier rather than to place a variable attenuator in front of it. In the first case, the noise employed in the calculation of the SNR entering the input of the operational amplifier to which a signal is applied, is entirely due to the operational amplifier itself including its feedback network. In the second case, the signal which reaches the operational amplifier input via the variable attenuator preceding the operational amplifier is attenuated by the variable attenuator, whereas the noise entering the input of the operational amplifier is enhanced by the noise contribution of the preceding variable attenuator. These two effects reduce the SNR in the second case, particularly if the attenuation is high.

High precision commercially manufactured gain controlled linear operational amplifiers, such as operational amplifier AD600/AD602 manufactured by Analog Devices, employ an attenuator in front of them. More recently, a method of employing MOS-FETs in the design of a current attenuator and varying the value of its attenuation by electronic switching between the MOS-FETs has been described in the paper "An Inherently Linear and Compact MOST-Only Current Division Technique" by K. Bult and G. Geelen, IEEE Journal of Solid State Circuits, 27 No. 123, Dec. 1992, pp. 1730–1735. The attenuator employed is of the R-2R kind, described in the book "Analog Signal Processing and Instrumentation", by Arieh Arbel, Cambridge University Press, 1980, on p. 208. FIGS. 8 and 9 of the Bult et. al. paper show a coarse and a fine section of the attenuator, respectively.

FIG. 7 of this paper shows how coarse and fine sections can be combined, and FIG. 10 of this paper shows the input and output circuits of the attenuator. This particular embodiment suffers from a number of inherent drawbacks. First, the operation of different transistors at different current levels introduces distortion into the output signal, resulting from the dependence of the dynamic resistance of each transistor on the input current signal. Second, the whole attenuator, shown in FIG. 10 of the above referenced paper, is divided into three major parts: a linear V-I converter forming the input section, which consists of a voltage amplifier such as NE5534 manufactured by NEC and the input branch of the attenuator, a current divider rendering the switched attenuator proper and a linear I-V converter forming the output stage. The drawbacks of this structure are the need for two separate operational amplifiers, the additional noise added to the signal by the linear I-V converter at the input, and last but not least, the deterioration of the SNR relating to the input of the linear I-V converter, caused by the attenuator employed in front of the linear I-V converter, as explained above.

A common method of controlling the gain of an operational amplifier employs passive linear resistors in the feedback network of the operational amplifier. The operational amplifier gain is controlled by varying the ratio of these passive resistors. Gain accuracy depends ultimately upon the ability to achieve an accurate ratio between two passive resistors, and to maintain this ratio during the manufacturing process and for different pairs of resistors over the whole range of operating temperatures. The presence of passive linear resistors satisfying these requirements complicates the manufacturing process of integrated circuits (ICs). However, resistors are linear components and lead to desired linear transfer functions from operational amplifiers.

U.S. Pat. No. 4,422,051 describes a different method of controlling the operational amplifier gain, which employs a variable attenuator comprised in the feedback path of a current amplifier. Unlike the present invention, this feedback network employs a total of four transistors, whose operation is based on the translinear principle which is explained in the paper by B. Gilbert, "Translinear Circuits: a proposed classification", Electronic Letters 11, No. 1, Jan. 9, 1975, pp. 14–16. This circuit has two major disadvantages. The first disadvantage is the distortion of the output signal which results from the unavoidable spread in the size of the transistors (width and length). The second disadvantage is stability problems in the closed loop response, resulting from the dependence of the frequency response of the feedback network's transfer function on $f_T$ of the transistors, where $f_T$ is the frequency at which the current gain of a transistor equals unity. Potential instability in the closed loop response adversely affects the bandwidth of the closed loop frequency response of the amplifier.

Chapter 1 of the book "Analog Signal Processing and Instrumentation", by Arieh Arbel, Cambridge University Press, 1980 discusses both voltage-mode and current-mode operational amplifiers.

Reference is made to FIG. 1 which shows a typical voltage-mode feedback stabilized amplifier (VMFA) 1 comprising a basic voltage amplifier 4 and a feedback network, operating in the voltage mode. The feedback network of VMFA 1 consists of resistors $R_f$ 2 and $R_o$ 3 and can be considered as a voltage divider, providing a voltage attenuation, $V_e/V_{out}$, which equals $R_o/(R_f+R_o)$. If the voltage gain $A_v=V_{out}/V_e$ of voltage amplifier 4 approaches infinity, and thus if $V_e$ approaches zero, the transfer-function of VMFA 1, $V_{out}/V_{in}$, approaches the value $(R_o+R_f)/R_o$, which is the inverse value of the voltage attenuation provided by the feedback network. Hence, gain accuracy depends ultimately upon the ability to achieve an accurate ratio between two linear, passive impedances, usually resistors, and to maintain this ratio during the manufacturing process and for individual pairs of resistors over the range of operating temperatures. The presence of resistors satisfying these requirements complicates the manufacturing of integrated circuits. However, resistors are linear components and lead to desired linear transfer functions from operational amplifiers.

FIG. 2 shows a recent version of a current-mode single ended feedback stabilized operational amplifier (CMFA) 6, described in the paper "Output Stage for Current-Mode Feedback Amplifiers, Theory and Application", Arieh F. Arbel and Lavy Goldminz, "Analog Integrated Circuits and Signal Processing", 2, (3) (1992), pp. 243–255. By "single ended" a single input and a single output is meant. This distinguishes a single ended amplifier from a differential amplifier having two inputs and two outputs of opposite phase.

CMFA 6 comprises a basic current amplifier, consisting of a transimpedance amplifier 14 (an operational amplifier) having an impedance ZT, which drives a current mode output stage (COS) 10. An output terminal 15 of the basic current amplifier is connected to a feedback network 2,3.

COS 10 has a pair of voltage input terminals Y1, Y2 and a pair of current output terminals, X2, Z2. Voltage terminal Y2 is driven by an output voltage $V_{out}$ of output voltage terminal 24 of amplifier 14, and voltage terminal Y1 is connected to ground. The two current terminals, X2 and Z2, are interconnected by COS 10. Current terminal X2 of COS 10 (node 15) is connected to the feedback network, and current terminal Z2 is connected to a grounded load 23 having an impedance ZL. COS 10 feeds an output current $I_{out}20$ into load 23.

The transfer function of COS 10 is $I_{out}=g_m V_{out}$, where $I_{out}19$ equals $I_{out}20$, $V_{out}$ is the output voltage of amplifier 14 at output voltage terminal 24, which is an input voltage to COS 10 applied via voltage terminal Y2, and $g_m$ is the transconductance of COS 10. $V_{X2}$ is the voltage across the feedback network, as measured, for example, at node 15.

CMFA 6 can employ either an FCS (floating current source) or a CCII- (class II current conveyor) as COS 10. Both the FCS and the CCII- are building blocks in analog current mode circuit design, which are described in the above referenced paper by Arbel and Goldminz.

Both the FCS and the CCII-, which can be employed as COS 10 as described above, are characterized by the fact, that the feedback current entering the first current terminal equals the output current leaving the second current terminal. This means that feedback current $I_{out}19$ entering current terminal X2 equals output current $I_{out}20$ flowing out of current terminal Z2. Hence the term "floating". The CCII- has additional features: whereas the voltage at terminal X2 is arbitrary for an FCS, it equals the voltage at terminal Y2 for an ideal CCII-. Furthermore, the output impedance at node X2 is high in the case of an FCS but low in the case of a CCII-. The choice of employing either an FCS or a CCII- as COS 10 has no bearing on the basic operation of the feedback network but both are mentioned here, since it will be shown that both the FCS and the CCII- have to be modified in order to be employed as COS 10 in preferred embodiments of the invention.

The open loop current gain of the basic current amplifier, $A_i=I_{out}/I_e$, equals $ZTg_m$, where ZT is the transimpedance of amplifier 14 and $g_m$ is the transconductance of COS 10, as defined above. Since inverting input terminal X1 of basic current amplifier 14 is ideally at zero potential both DC wise and for an AC signal, the feedback network of CMFA 6 can be considered as a current divider, having attenuation $I_f/I_{out}$ which equals $R_o/(R_f+R_o)$, where $I_{out}$ equals $I_{out}19$ and $I_{out}20$. If $A_i$ of operational amplifier 14 approaches infinity, $I_e$ approaches zero and the closed loop transfer function of CMFA 6 approaches the inverse value of the feedback attenuation, i.e. $I_{out}/I_{in}$ approaches $(R_f+R_o)/R_o$. Resistor $R_f$ 2 will be identified herein as the feedback resistor and resistor $R_o$ 3 as the gain setting resistor.

Hence, the current transfer function of CMFA 6 comprising a basic current amplifier having a substantially infinite current gain $A_i$, equals $(R_o+R_f)/R_o$. $R_f$ 2 and $R_o$ 3 are driven in parallel both with respect to a DC and an AC signal.

In all following figures, as in FIG. 2, $V_{X2}$ represents the voltage applied by the basic current amplifier across the feedback network, as measured, for example, at junction 15, and $I_e$ represents the error current which acts as an input signal to amplifier 14. $I_f$ represents the feedback current flowing through resistor $R_f$ 2 or through the non-linear element or elements substituting $R_f$ 2, comprised in preferred embodiments of the invention. $I_{out}19$ represents the total current flowing out of the feedback network and entering current terminal X2 of COS 10. $I_{out}19$ entering current terminal X2, which equals output current $I_{out}20$, flowing out of current terminal Z2 of COS 10 into load 23, equals $-V_{X2}/(R_o\|R_f)$ which equals $-V_{X2}(R_o+R_f)/R_oR_f$, where $R_o\|R_f$ is the equivalent resistance of $R_o$ and $R_f$ connected in parallel.

SUMMARY OF THE INVENTION

It is an object of the present invention to provide an alternative for the passive linear resistors conventionally employed as elements in feedback networks, in order to linearize the gain of current-mode feedback amplifiers (CMFAs), to reduce their harmonic distortion and to render the transfer function of the CMFA insensitive to spread between the parameters of the amplifying devices resulting from manufacturing differences and to drift of electrical parameters resulting from temperature variations.

The present invention overcomes the limitations of the prior art by employing a feedback network or attenuator comprising substantially identical non-linear active elements, in order to achieve an inherently linear and frequency independent current gain or attenuation, which can be varied either continuously or in steps employing electronic switching.

Furthermore, active elements are present in an IC anyway, and the absence of resistors significantly simplifies the manufacturing process of ICs.

One aspect of the invention includes the use of a feedback network consisting of a plurality, n+1, of substantially electrically identical active, non-linear elements, n of which are connected in parallel. The non-linear elements substitute for conventional passive resistors in the feedback network, to provide a linear frequency independent current gain.

The inherent linearity of such a feedback network is due to the fact that the non-linear elements are connected both DC and AC wise in parallel, in a manner in which a substantially equal voltage is applied across each of the substantially identical elements in response to the feedback current of the CMFA. As a result a substantially equal current flows through each of the non-linear elements. Hence, the ideal current gain of the CMFA or attenuation achieved by the feedback network, is inherently linear and frequency independent.

Another aspect of the invention includes the use of unidirectional active elements comprised in the feedback network and fed by a modified current output stage (COS), so that the current flowing through the non-linear elements does not reverse polarity although the current which is derived from the COS and flows into the load does reverse polarity.

Another aspect of the invention includes application of external voltages to chosen terminals of some of the non-linear active elements comprised in a feedback network, to obtain a coarse and a fine control and to enhance the accuracy of the gain of the feedback network.

Another aspect of the invention includes the use of a feedback network consisting of two assemblies of substantially electrically identical, non-linear active elements. The first assembly consists of N active non-linear active elements connected in parallel, and the second assembly consists of M active non-linear elements connected in parallel. This feedback network can be configured to provide a frequency independent linear current gain or attenuation, the value of which depends on the ratio M/N and can be varied over a wide range of values.

There is therefore provided in accordance with a preferred embodiment of the invention an electronic circuit comprising:

a basic amplifier having an input port which is a virtual ground and at least one output port;

a network comprising a plurality of substantially electrically identical, non-linear, elements arranged in first and second assemblies, wherein said first assembly comprises at least one of said elements, said second assembly comprises at least one of said elements, wherein at least one of said first and second assemblies comprise a plurality of said elements arranged in parallel and wherein the first assembly is connected between the input port and the output port and the second assembly is connected between the output port and a ground or virtual ground other than the input port.

In one preferred embodiment of the invention the virtual ground other than the input is the input to a second operational amplifier.

In a preferred embodiment of the invention the basic amplifier comprises an operational amplifier and a COS output stage, preferably either a FCS or CCII- stage, having first and second output ports. Said first assembly is connected between said first output port and said input port, wherein said second assembly is connected between said first output port and said ground or virtual ground other than said input port and wherein said second output has an output current substantially equal to the output current of the first output terminal and is connected to the load.

There is further provided in accordance with a preferred embodiment of the invention, an electronic circuit comprising:

a basic amplifier having an input port and at least one output port;

a network comprising a plurality of substantially electrically identical, non-linear, elements arranged in first and second assemblies, wherein said first assembly comprises at least one of said elements, said second assembly comprises at least one of said elements, wherein at least one of said first and second assemblies comprise a plurality of said elements arranged in parallel and wherein the first assembly is connected between the input port and ground and the second assembly is connected between the output port and a ground or virtual ground other than the input port.

Preferably, the basic amplifier comprises an operational amplifier and a COS output stage, preferably of the FCS or CCII- type, having first and second output ports said second assembly is connected between said first output port and said ground or virtual ground other than said input port and wherein said second output port has an output current substantially equal to the output current of the first output port.

Preferably the number of elements in the first assembly of the above preferred embodiments is different from than the number of elements in the second assembly, whereby the circuit is a current amplifier having a linear transfer function which is substantially independent of frequency.

There is further provided, in accordance with a preferred embodiment of the invention, an electronic circuit comprising a current source feeding a current dividing network comprising a plurality, N+M, of substantially identical non-linear elements connected in two parallely connected groups of N and M elements each, to provide a linear current attenuation of M/(N+M).

There is further provided an electronic circuit comprising:

a basic amplifier; and a feedback network consisting substantially of a plurality, N+M, of substantially identical non-linear elements connected in parallel in two groups of N and M elements each, to provide a linear feedback stabilized gain of 1+(M/N).

In a preferred embodiment of the invention, the basic amplifier comprises an operational amplifier and a COS output stage, preferably of the FCS or CCII- type, having first and second output ports one of said groups is connected between said first output port and said input port and the other of said groups is connected between said first output port and ground. The second output port is connected to a load.

There is further provided an electronic circuit comprising:

a basic amplifier, for example an operational amplifier, having an input port which is a virtual ground; and a stabilizing network consisting substantially of a plurality, N+M, of substantially identical, non-linear elements connected in parallel in two groups of N and M elements each, to provide a linear feedback stabilized gain or attenuation of (M/N).

In one preferred embodiment of the invention, the basic amplifier comprises an operational amplifier and a COS output stage, preferably of the FCS or CCII- type, having first and second output ports, said first output port being connected to the input port. One of said groups is connected between said first output port and ground and the second of said groups is connected between ground and said input port. The second output port is connected to a load.

Alternatively, the basic amplifier is an operational amplifier and one of the groups is connected between a voltage output port of the amplifier and the input port of the operational amplifier and the second group is connected between the output port and the virtual ground input port of a subsequent amplifier to provide a linear feedback stabilized gain or attenuation of (M/N).

In a preferred embodiment of the above mentioned embodiments said non-linear elements are MOS-FETs, each MOS-FET having Source, Bulk, Gate and Drain terminals; and said circuit comprises a switching arrangement which is operative to connect said Gate and Bulk terminals of at least one of said MOS-FETs, for providing a coarse gain control.

Additionally or alternatively in a preferred embodiment of the above mentioned embodiments said non-linear elements are MOS-FETs, each MOS-FET having Source, Bulk, Gate and Drain terminals;

wherein said circuit comprises a first power supply which electrifies said Bulk terminals of said MOS-FETs; and said circuit comprises a second power supply which electrifies said Bulk terminal of at least one of said MOS-FETs; and said circuit comprises a potentiometer which is connected between said first and second power supplies and which varies the voltage applied to said Bulk terminal of at least one of MOS-FETs, for providing a fine gain control.

Additionally or alternatively in a preferred embodiment of the above mentioned embodiments said non-linear elements are MOS-FETs, each MOS-FET having Source, Bulk, Gate and Drain terminals;

wherein said circuit comprises a voltage source which supplies a time-varying voltage; and wherein said power supply electrifies said Bulk terminal of at least one of said MOS-FETs, for providing a time-modulated linear gain.

BRIEF DESCRIPTION OF THE DRAWINGS

The present invention will be understood and appreciated more fully from the following detailed description taken in conjunction with the following drawings in which:

FIG. 9A shows a configuration of a differential CMFA consisting of two assemblies, each assembly comprising a feedback network such as shown in FIG. 7 and employing an FCS as a COS, in accordance with a preferred embodiment of the invention;

DETAILED DESCRIPTION OF PREFERRED EMBODIMENTS OF THE INVENTION

Figure 1:
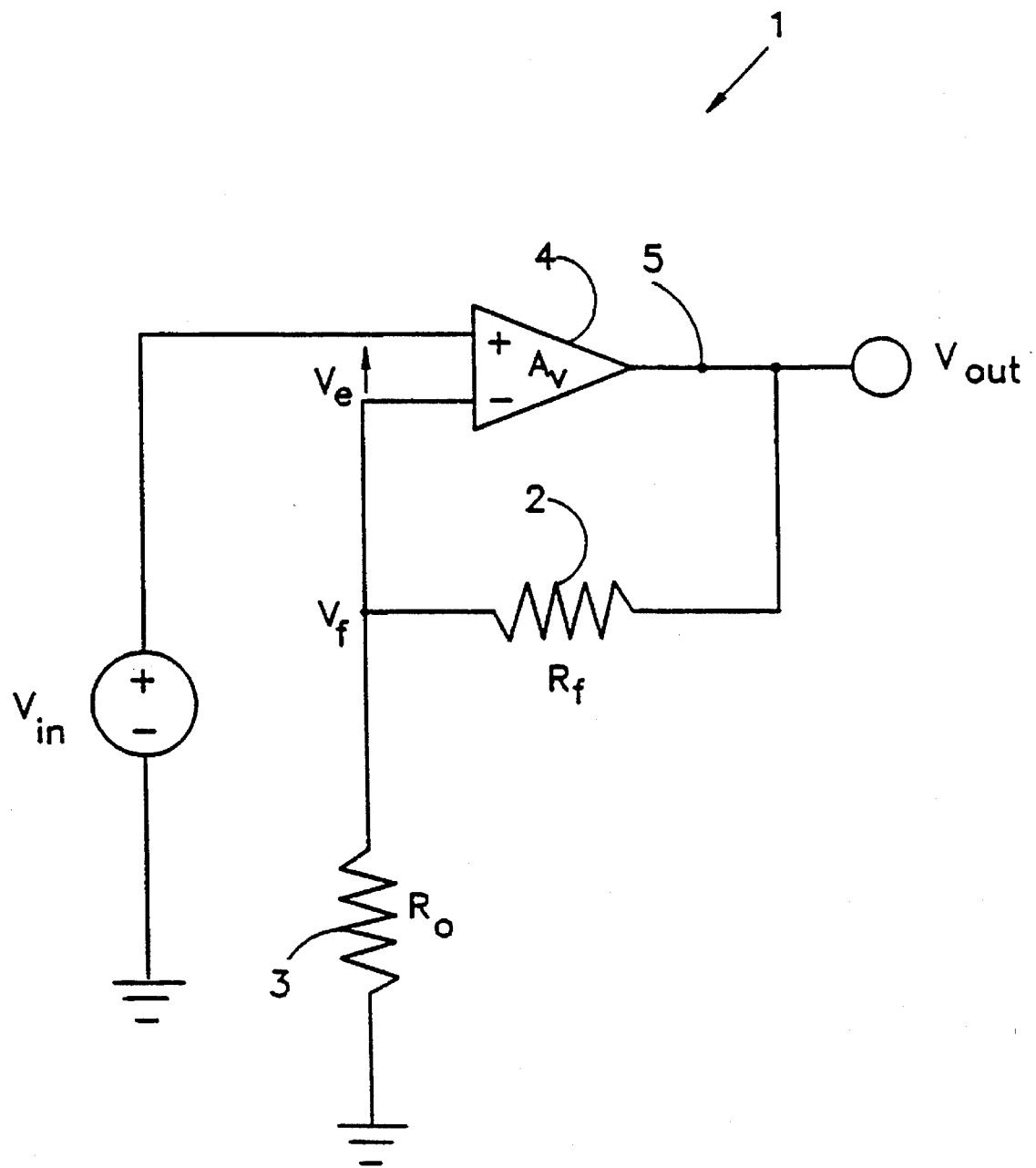
FIG. 1 shows a schematic block diagram of a conventional voltage-mode operational feedback amplifier (VMFA)
Figure 2:
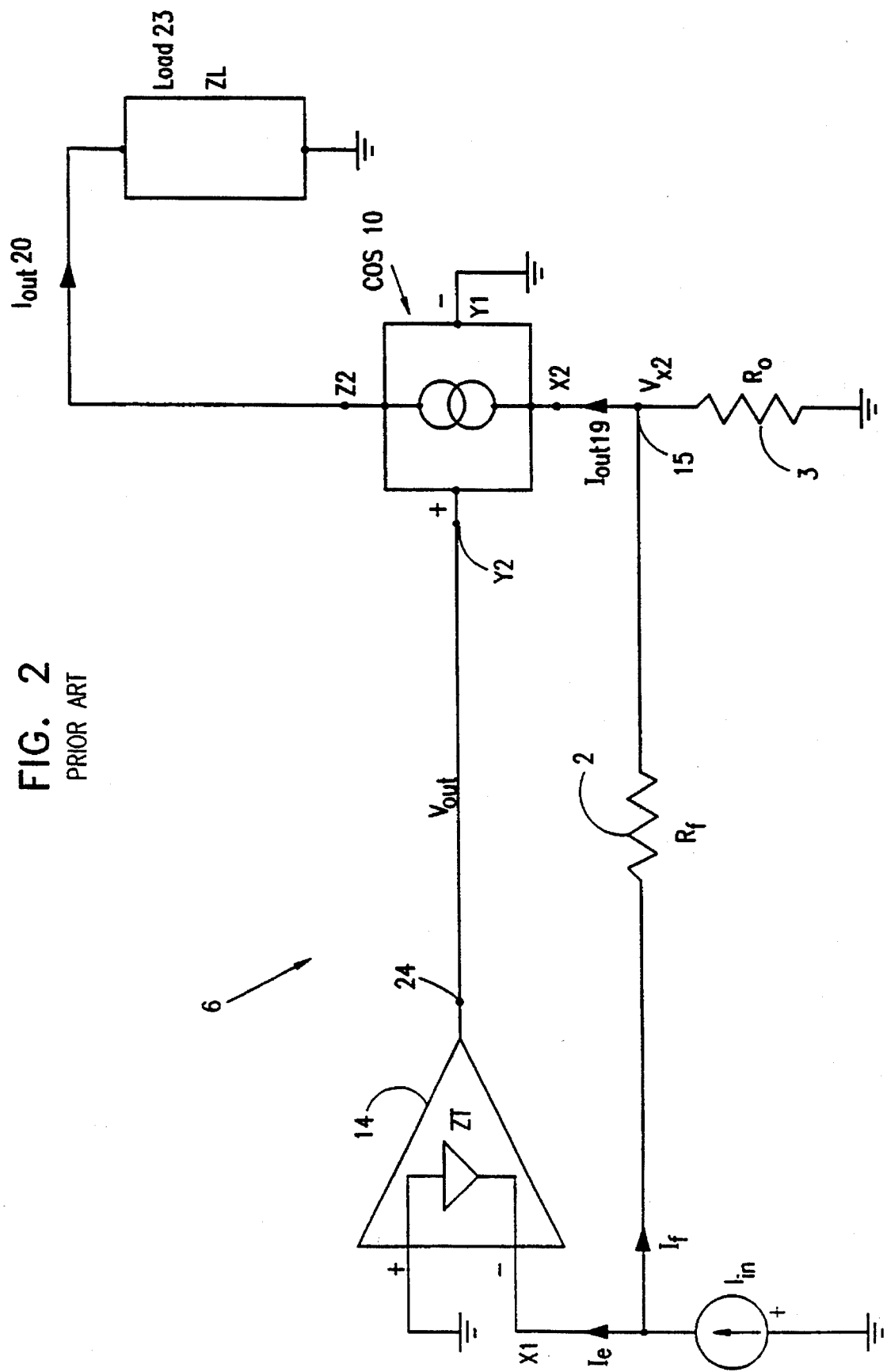
FIG. 2 shows a schematic block diagram of a conventional current-mode operational feedback amplifier (CMFA)
Figure 3A:
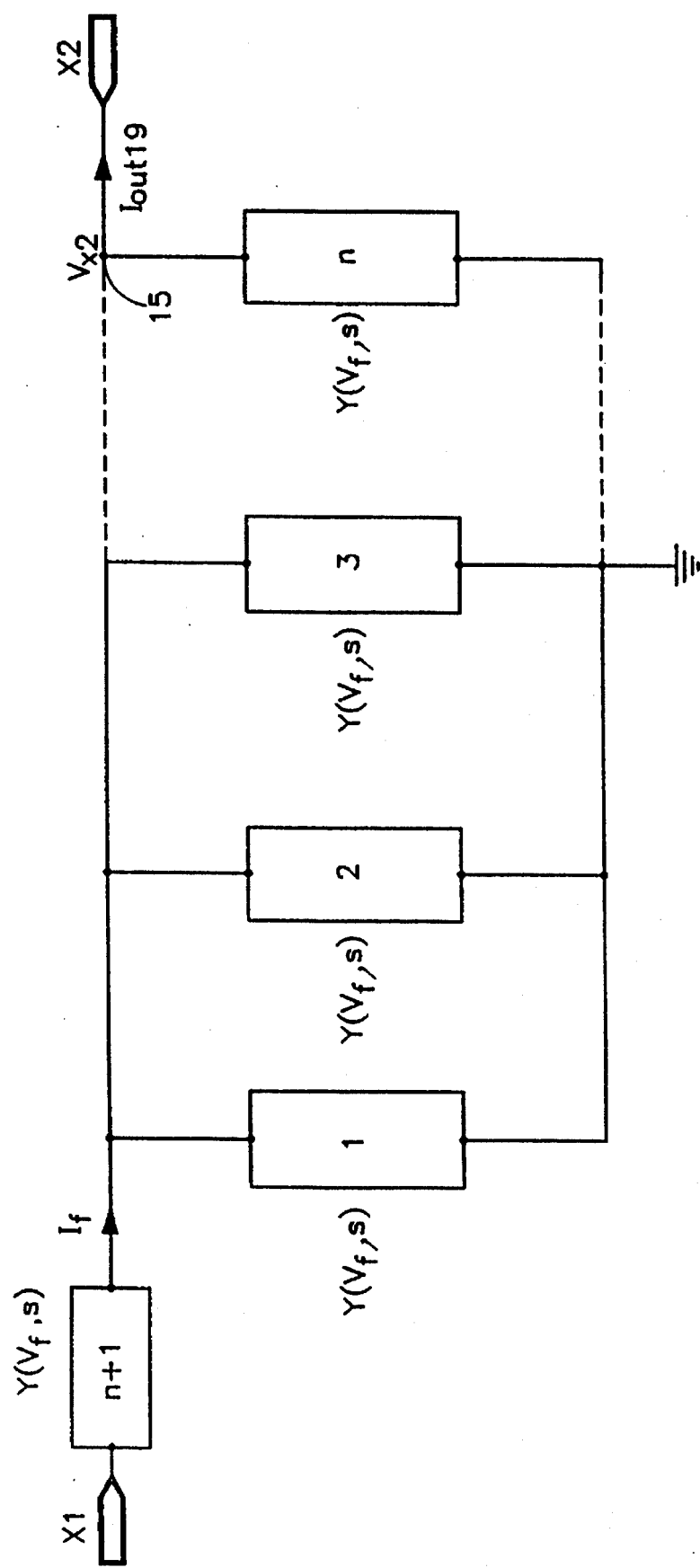
FIGS. 3A and 3B show schematic block diagrams of a feedback network consisting of n+1 non-linear active elements, in accordance with a preferred embodiment of the invention.
Figure 3B:
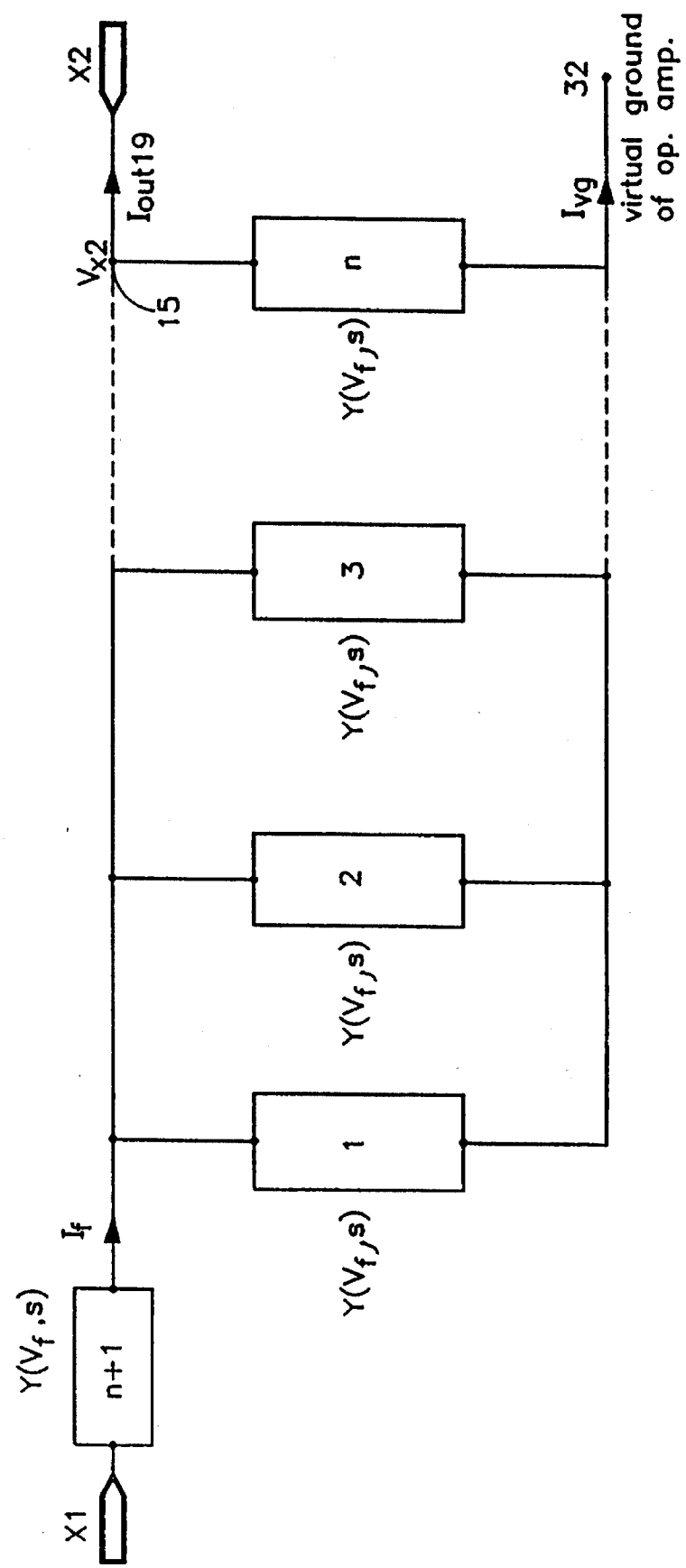

FIGS. 3A and 3B show a feedback network comprising n+1 non-linear elements and connected between an inverting current input terminal X1 of amplifier 14 (FIG. 2) and first output port X2 of COS 10 (FIG. 2), in accordance with preferred embodiments of the invention. The rectangles labeled 1 to n+1 represent substantially identical non-linear elements, such as MOS transistors. Non-linear elements 1 to n substitute for resistor $R_o$ 3 shown in FIG. 2, and non-linear element n+1 substitutes for resistor $R_f$ 2 shown in FIG. 2. Each of non-linear elements 1 to n+1 has a complex admittance $Y(V_f,s) = \text{Re}[Y(V_f,s)] + j\text{Im}[Y(V_f,s)]$, which is dependent on the voltage across the non-linear elements $V_f$ (which equals $V_{X2}$), and on a complex frequency s.

FIG. 3A shows in detail a feedback network which replaces the feedback network shown in FIG. 2.

FIG. 3B shows a feedback network such as in FIG. 3A to which voltage $V_{X2}$ is applied and which provides an output current $I_{vg}$, extracted from non-linear elements 1 to n, which flows into an input current terminal 32 of a following operational amplifier (not shown), which is a virtual ground. Assuming that the virtual ground of terminal 32 is exactly at ground potential, signal currents flowing in FIG. 3B will be an accurate replica of those flowing in FIG. 3A.

Figure 4A:
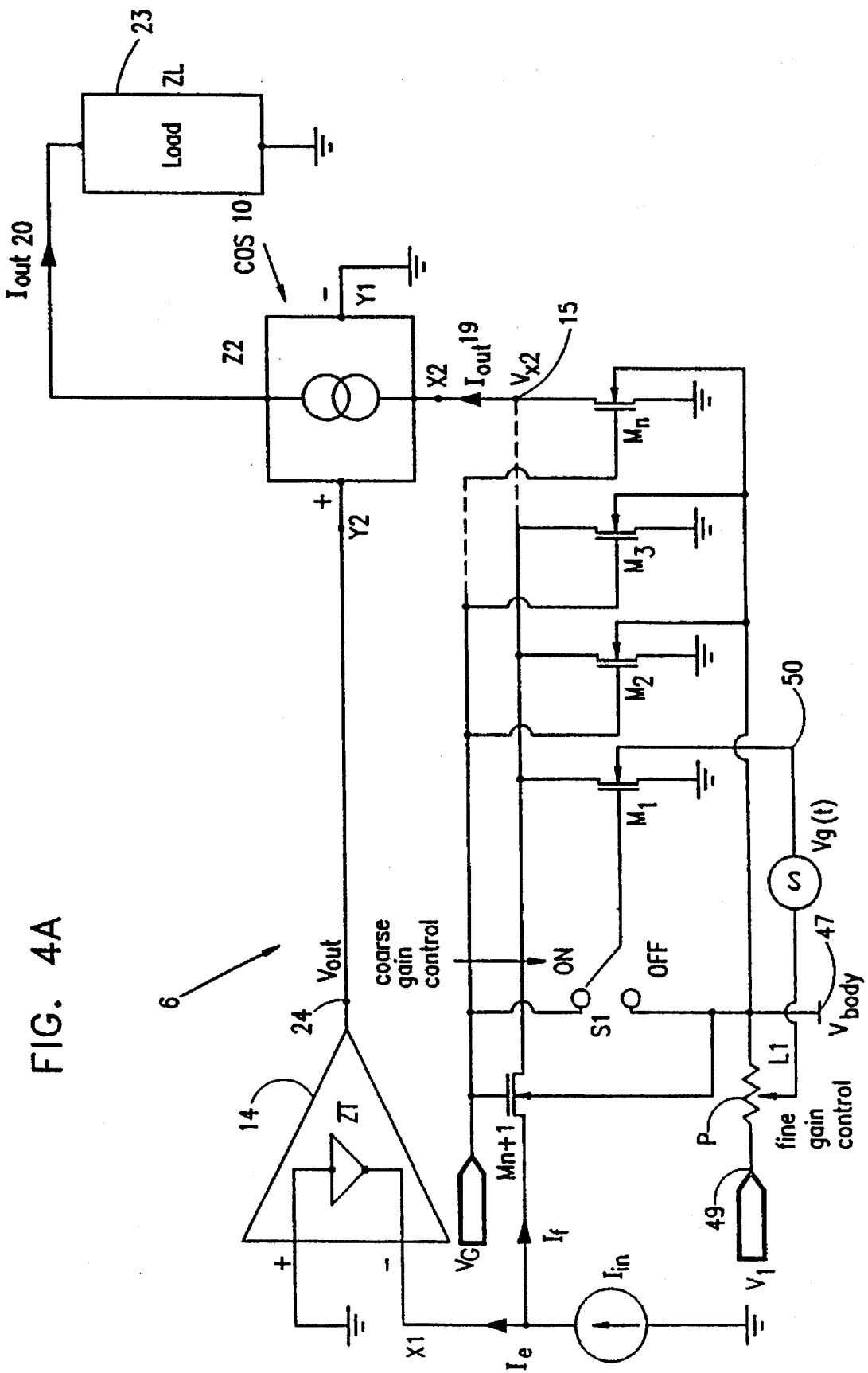
FIG. 4A shows a schematic block diagram of a configuration of a CMFA in which the non-linear elements of the feedback network are N-channel MOS-FETs, in accordance with a preferred embodiment of the invention and including a basic amplifier comprising a transimpedance amplifier and a COS.
Figure 4B:
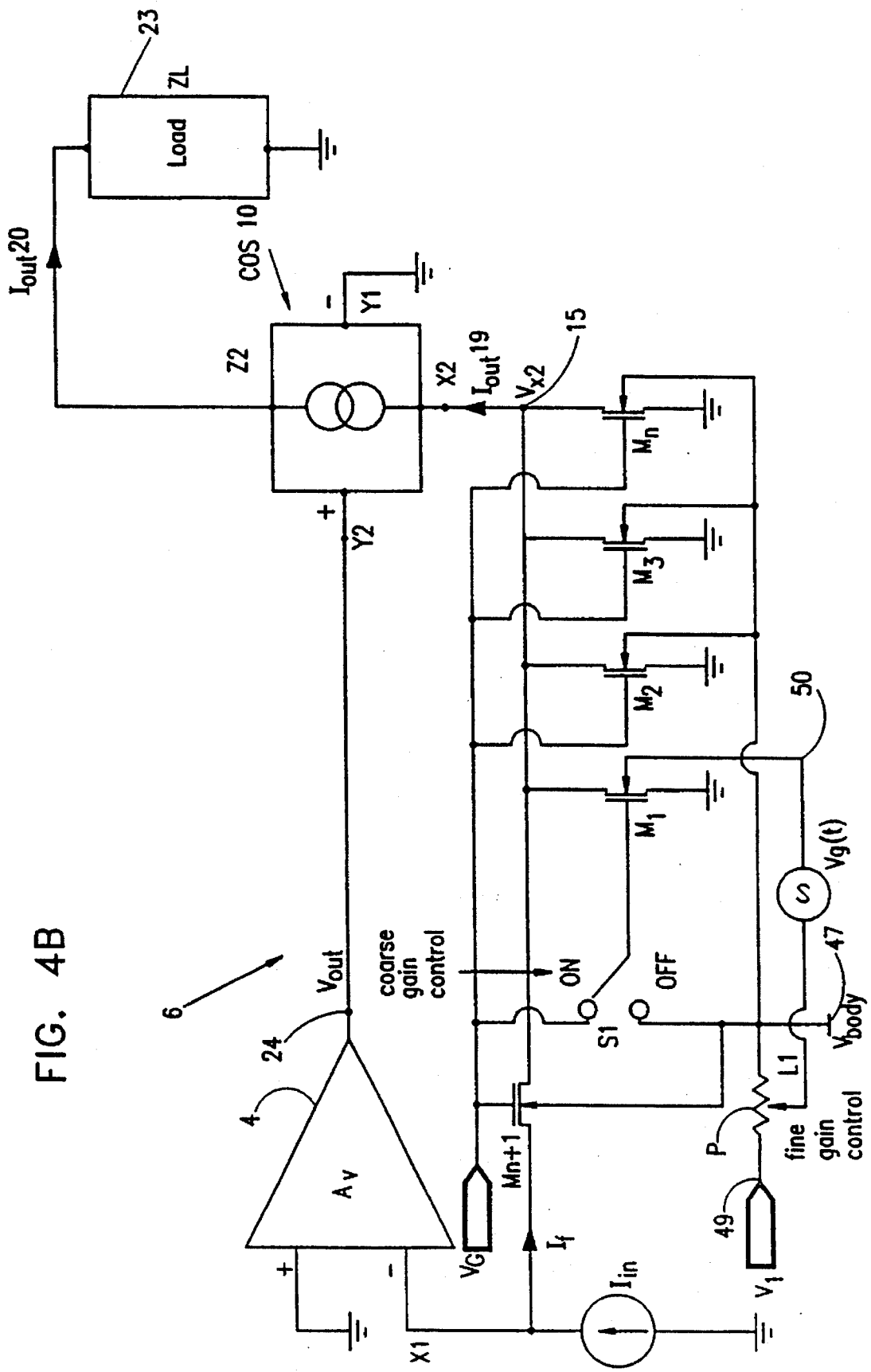
FIG. 4B shows a schematic block diagram of a CMFA whose basic amplifier is a voltage-mode amplifier and a COS, in accordance with a preferred embodiment of the invention.
Figure 4C:
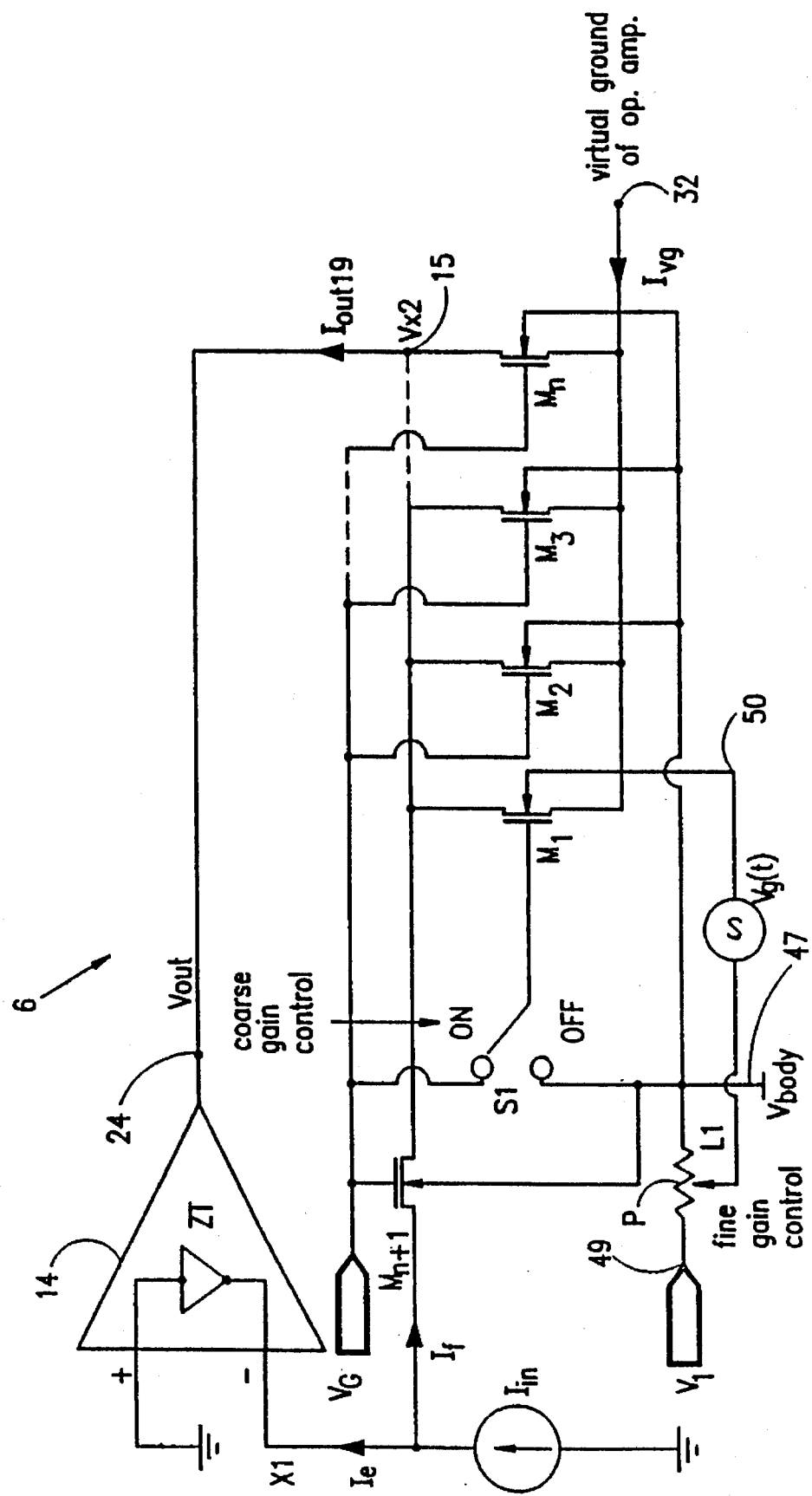
FIG. 4C shows a schematic block diagram of a CMFA in which the current extracted from n non-linear elements of the feedback network flows into a virtually grounded terminal of an external operation amplifier (not shown), in accordance with a preferred embodiment of the invention.

Reference is now made to FIGS. 4A–4C which show configurations of CMFA 6 comprising a feedback network such as shown in FIG. 3, in which non-linear elements $M_1$ to $M_{n+1}$ comprised in the feedback network consist of N-channel MOS-FETs (field effect transistors), according to preferred embodiments of the invention.

According to alternative preferred embodiments of the invention, non-linear elements $M_1$ to $M_{n+1}$ consist of P-channel MOS-FETs.

Figure 5:
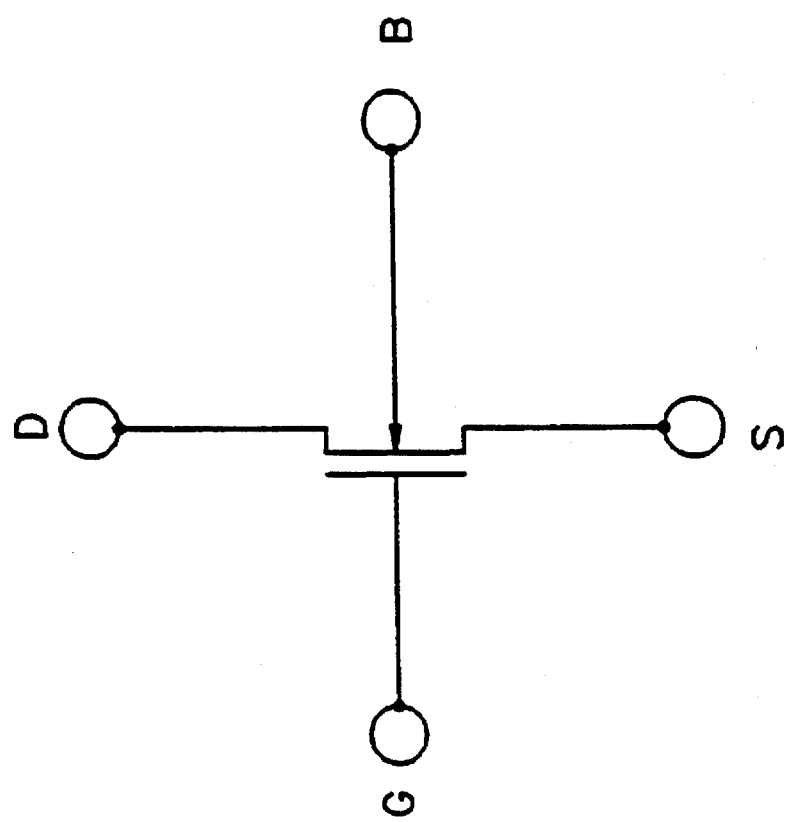
FIG. 5 is a schematic illustration of an N-channel MOS-FET.

As is well known, a MOS-FET has a Gate terminal G, a Bulk or Body terminal B, a Drain terminal D and a Source terminal S, to which voltages $V_G$, $V_B$, $V_D$ and $V_S$ are applied, respectively. FIG. 5 shows a schematic block diagram of such an N-channel MOS-FET. "Bipolar and MOS Analog Integrated Circuit Design", by Alan B. Grebene et al, John Wiley & Sons, 1984, Chapter 2.5, pages 106–112 describes the electrical characteristic of N-channel and P-channel enhancement and depletion MOS-FETs. There it is shown, that these devices may be operated either in the triode region or in the saturated or pinched off region, depending upon the ratios between voltages $V_S$, $V_G$, $V_D$ and $V_B$ applied to the Source, Gate, Drain and Body (or Bulk), respectively. See for example FIG. 2.40 of Grebene et al. on page 107, op cit. In the triode region, the MOS-FET acts as a bidirectional non-linear resistance and the Drain current increases proportionally to an increase in the Drain voltage $V_D$. In the pinched off region, the Drain current remains roughly constant if the Gate voltage is constant as the Drain voltage increases. If the Drain and Gate are interconnected, it is well known in the art that the transistor operates in the pinched off region and therefore behaves as a non-linear unidirectional resistance whose value equals the inverse of the channel conductance. The value of $V_B$ applied to the Body terminal must never become positive with respect to any of the other N-channel MOS-FET terminals, since otherwise the diode formed by the interface between the Body terminal and at least one of the other terminals would enter the conducting region.

According to a preferred embodiment of the invention the resistances of resistors $R_f$ 2 and $R_o$ 3 shown in FIG. 2 are replaced by the channel resistances of the MOS-FETs employed as non-linear elements $M_1$ to $M_{n+1}$ in the feedback network. The channel resistance is the inverse of the channel conductance between the Source and the Drain of MOS-FETs operating in the triode region, as given by the following equation:

$$g_c(x) = \mu_s C_{ox}(V_{GS} - V(x) - V_{TH})$$

where:

$g_c(x)$ is the channel conductance as a function of the distance x along the channel from the Drain;

$\mu_s$=the surface mobility of the majority charge carriers in the induced channel;

$C_{ox}$=capacitance per unit area of the Gate electrode;

$V_{GS}$=the voltage difference between the Gate and the Source terminals.

$V(x)$=the channel potential at a distance x from the Source; and $V_{TH}$=the threshold voltage of the transistor;

This is equation (2.46) on page 109 of Grebene et al., op cit. Operation in the triode region is ensured if the condition $V_G > V_{Dmax} + V_{TH}$ is satisfied. $V_{TH}$ is the threshold voltage beyond which the Drain current is substantially constant; that is, if $V_{GS}$ is increased above the threshold voltage $V_{TH}$, the P-type region directly below the Gate would invert to its conductivity region and form an N-type channel.

The triode region is characterized by the fact that voltage $V_{X2}$ applied to the feedback network in the configurations shown FIGS. 4A–4C may change polarity. Since for an N-channel MOS-FET the condition $V_D > V_S$ must always be satisfied, the Drain becomes the Source and Source becomes the Drain if $V_{X2}$ changes polarity and becomes negative. Hence, the feedback branches comprising N-channel MOS-FETs are bidirectional, i.e. current can flow in both directions, for which reason the MOS-FET terminals S and D are not identified as such in FIG. 4, since these terminals can interchange.

MOS-FET $M_{n+1}$ shown in FIG. 4 replaces feedback resistor $R_f$ 2 shown in FIG. 2, and MOS-FETs $M_1$ to $M_n$, connected in parallel, replace resistor $R_o$ 3 shown in FIG. 2.

Since a substantially identical voltage, which equals $V_{X2}$, is applied to the same terminals of substantially identical MOS-FETs $M_1$ to $M_{n+1}$, the currents flowing through MOS-FETs $M_1$ to $M_{n+1}$ are substantially equal. Hence, the current transfer function of CMFA 6 comprising a basic current amplifier having an infinite current gain $A_i = I_{out}/I_e$, equals $1+[nY(V_{X2},s)/Y(V_{X2},s)] = n+1$, which is independent of $V_{X2}$ and of the complex frequency s.

The Gate terminals of MOS-FETs $M_1$ to $M_{n+1}$ are connected to a DC voltage $V_G$, thereby satisfying the condition for operation in the triode region. Current gain control can be obtained via MOS-FETs $M_1$ to $M_{n+1}$ by varying the individual voltages applied to the Gate terminals of MOS-FETs $M_1$ to $M_{n+1}$.

FIGS. 4A–4C also show a switching arrangement in which a switch S1 can disconnect the Gate terminal of MOS-FET $M_1$ from $V_G$ and bias it negatively with respect to the Source terminal, by connecting the Gate terminal to the Body terminal to which $V_{Body}$ is applied. Consequently, the channel conductance of MOS-FET $M_1$ is reduced to zero, thereby reducing the total current gain of CMFA 6 from n+1 to n. By applying a switching arrangement such as shown with switch S1 to m MOS-FETs, where m=0, 1, 2, . . . n, a coarse electronic gain control can be obtained, in which the current gain, which equals n+1−m, can be changed between 1 and n+1.

As is well known, the total channel conductance $g_{mT}$ between the Drain terminal and the Source terminal of a MOS-FET is a function of both $V_{GS}$, the voltage difference between the Gate and the Source terminals, and $V_{BS}$, the voltage difference between the Bulk and the Source terminals. The total channel conductance $g_{mT}$ is given by the following equation:

$$g_{mT} = g_m(V_{GS}) + g_{mb}(V_{BS})$$

where $g_m(V_{GS})$ is the transconductance of the Gate channel and $g_{mb}$ is the transconductance of the Bulk channel. See, for example, "CMOS Analog Circuit Design", P. Allen and D. Holberg, Holt, Rinehart and Winston, Inc. 1987, p. 114–116. This effect can be utilized to obtain a fine gain control by connecting the Bulk terminals of chosen MOS-FETs of MOS-FETs $M_1$ to $M_n$, to a slider L1 of a potentiometer P, as shown in FIGS. 4A–4C.

A fine gain control is obtained by changing voltage $V_B$ applied to the Bulk terminals of MOS-FETs which are connected to slider L1 of potentiometer P. By moving slider L1 voltage $V_B$ is varied between $V_{Body}$ as measured, for example, at node 47 and $V_1$ as measured, for example, at node 49. $V_1$ is positive or negative with respect to $V_{Body}$, where $V_{Body} < 0$, depending on whether adjustment of P potentiometer should increase or decrease the feedback stabilized gain. This adjustment can also be utilized to calibrate the current gain of CMFA 6, whose value may not exactly equal n+1 due to manufacturing differences between MOS-FETs $M_1$ to $M_n$.

Furthermore, the output signal of CMFA 6 can be modulated by applying a time varying voltage $V_b(t)$ to those Bulk terminals of MOS-FETS which are connected to node 50.

FIG. 4A shows a configuration of CMFA 6 which comprises a basic current amplifier which consists of a transimpedance amplifier 14 (operational amplifier) having a transimpedance ZT and cascaded with COS 10.

FIG. 4B shows a configuration of CMFA 6 similar to that in FIG. 4A in which a voltage operational amplifier 4 having a voltage gain $A_v$ replaces amplifier 14.

FIG. 4C shows a configuration of CMFA 6 in which voltage $V_{x2}$ is applied to the feedback network directly by amplifier 14, which can also be substituted by a voltage amplifier as in the configuration shown in FIG. 4B. In addition, the Source terminals of MOS-FETs $M_1$ to $M_n$ in FIG. 4C are connected through terminal 32 to a virtual ground of a following external operational amplifier (not shown), while in FIGS. 4A and 4B those terminals are at an exact ground potential. The output current $I_{vg}$, which is extracted from MOS-FETs $M_1$ to $M_n$ and which flows into terminal 32, equals $nI_{in}$, since all transistors carry the same current $I_n$.

Hence, utilizing a configuration such as shown in FIG. 4C, comprising a single amplifier and a non-linear feedback network in conjunction with an independent external operational amplifier, a linear variable current gain which equals n can be obtained.

While the coarse gain control, fine gain control, and time varying gain control mechanisms are shown only in FIGS. 4A–4C, they are also applicable to the other embodiments of the invention described infra.

Figure 6A:
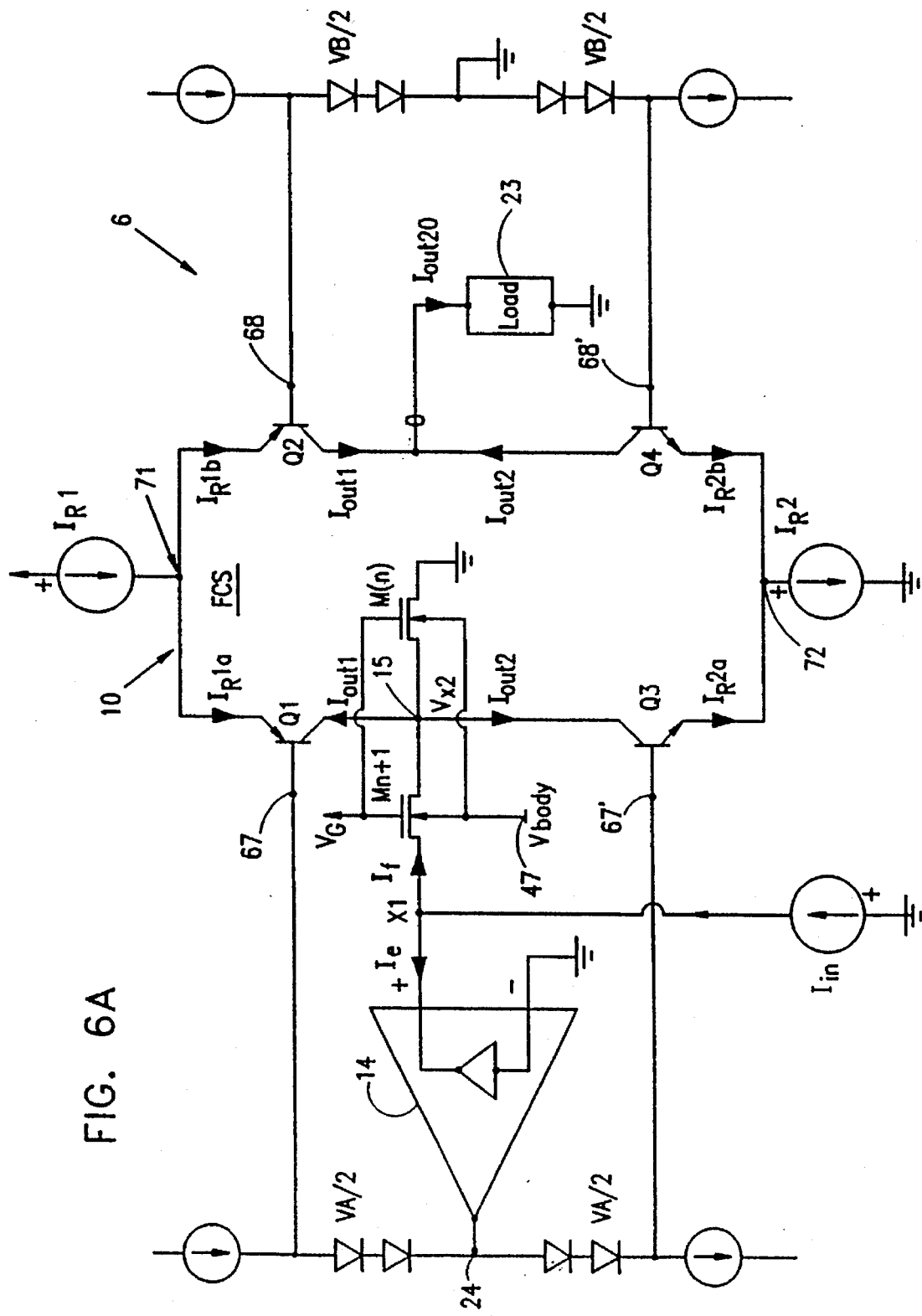
FIG. 6A shows a schematic block diagram of a CMFA, which employs an FCS as a COS and comprises a bidirectional feedback network consisting of n+1 N-channel MOS-FETs, in accordance with a preferred embodiment of the invention.
Figure 6B:
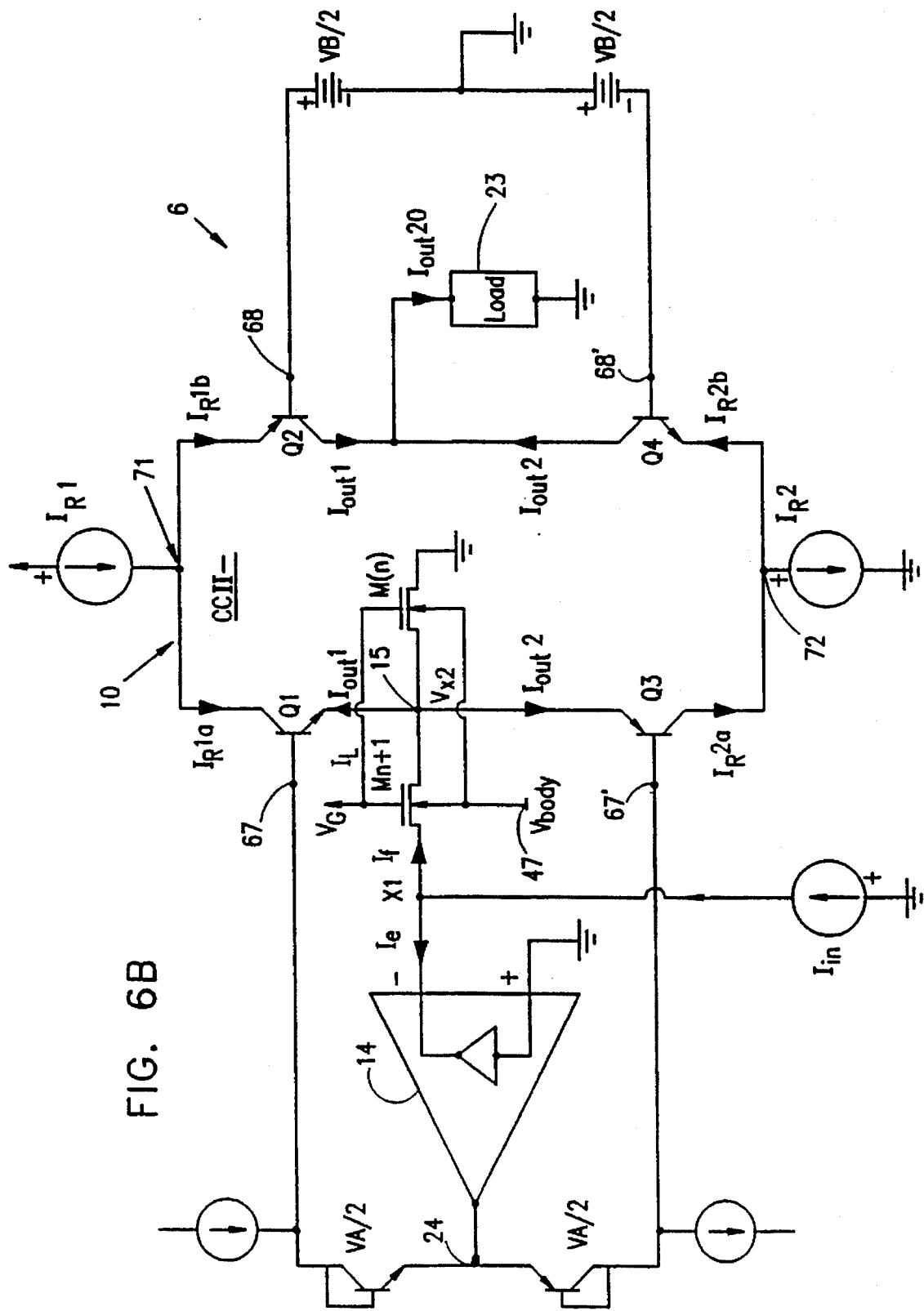
FIG. 6B shows a schematic block diagram of a CMFA, which employs a CCII- as a COS and comprises a feedback network such as shown in FIG. 6A, in accordance with a preferred embodiment of the invention.

FIGS. 6A and 6B show configurations of CMFA 6, according to preferred embodiments of the invention. The configuration shown in FIG. 6A comprises a feedback network such as shown in FIGS. 4A–4C, which is connected to a conventional FCS employed as COS 10. MOS-FET $M_{n+1}$ corresponds MOS-FET $M_{n+1}$ shown in FIGS. 4A–4C, and MOS-FET M(n) corresponds collectively to MOS-FETs $M_1$ to $M_n$ shown in FIGS. 4A–4C. Alternatively, a plurality of parallel transistors can be used in place of MOS-FET $M_{n+1}$. $V_G$, the voltage applied to the Gate terminals of MOS-FETs $M_1$ to $M_{n+1}$ is set as described above in reference to FIG. 4, to ensure operation of MOS-FETs $M_1$ to $M_{n+1}$ in the triode region. The FCS employed as COS 10 comprises bipolar transistors Q1, Q2, Q3 and Q4. In order to ensure proper working conditions for the FCS, DC voltages VA/2 and VB/2 are applied to the Base terminals of transistors Q1 to Q4.

In this embodiment, while the exact values of VA and VB are not critical, they should be the same. It will be appreciated by those skilled in the art, that DC conditions for the FCS feeding the feedback network must ensure that the value of the DC voltages VA/2 applied between Base nodes 67 and 67' of bipolar transistors Q1 and Q3 respectively, approximately equals VB/2 applied between Base nodes 68 and 68' of transistors Q2 and Q4, respectively. Thus, the method shown for generating VA and VB is the same, as shown. Other methods of generating these voltages, as known in the are may also be used.

As described in the above referenced paper by Arbel and Goldminz, the FCS which is employed as COS 10 is fed by two externally supplied constant reference currents, a source current $I_R1$ flowing into a terminal 71 of the FCS and a sink current $I_R2$ flowing out of terminal 72 of the FCS. $I_R1$ preferably equals $I_R2$, and both $I_R1$ and $I_R2$ preferably equal twice the value of the maximum value of the output current $I_{outmax}$, which is the maximum of $I_{out}20$. Each of reference currents $I_R1a$ and $I_R2$ divides into two currents: $I_R1$ divides into IR1a which equals $0.5(1-x)I_R1$ and $I_R1b$ which equals $0.5(1+x)I_R1$, and $I_R2$ divides into $I_R2a$ which equals $0.5(1+x)I_R2$ and $I_R2b$ which equals $0.5(1-x)I_R2$. In absence of a signal $I_{in}$ the voltages VB/2 and VA/2 applied to the Base terminals of Q1, Q2 and Q3, Q4 respectively are substantially equal, and the currents flowing through $Q_1$, $Q_3$ and $Q_2$, $Q_4$ are equal as well, i.e. x=0.

It follows that feedback current $I_f$ flowing through MOS-FET $M_{n+1}$ equals zero and the voltage $V_{x2}$ across the feedback network is zero as well. Hence, x=0 and no output current $I_{out}20$ flows into load 23.

In presence of a signal $I_{in}$, the currents flowing through Q1, Q3 and Q2, Q4, respectively, unbalance and feedback MOS-FETs $M_1$ to $M_{n+1}$ create output currents $I_{out}1$ and $I_{out}2$ which both equal $0.5xI_R$ 19. $I_{out}1$, which flows through Q1 and Q2, and $I_{out}2$, which flows through Q3 and Q4, combine into $I_{out}20$ which flows into load 23 and which equals $xI_R$, where $I_R$ is either $I_R1$ or $I_R2$, since $I_R1$ or $I_R2$ are preferably equal. No signal current flows into $I_R1$ and $I_R2$, since we assume that these are ideal DC current sources.

Those skilled in the art will appreciate, that the above indicated current values assume that the current gain $A_i$ of each of transistors Q1 to Q4 is infinitely large, causing the corresponding Emitter and Collector currents to be substantially equal and the Base currents to substantially equal zero.

FIG. 6B shows a configuration of CMFA 6 comprising a feedback network such as in FIG. 6A but employing a CCII-, instead of an FCS, as COS 10. Here, voltage $V_{x2}$ is applied to the feedback network from a low impedance, since Q1 and Q3 operate as emitter followers.

Those skilled in the art will recognize, that Q1, Q2 and Q3, Q4 now form a cascode, which increases the output impedance of the output stage compared to the corresponding impedance in FIG. 6A.

Furthermore, the cascode also relaxes the DC bias conditions from $V_B \approx V_A$ in FIG. 6A to $V_B > V_A$. On the other hand, the bias, VA/2 should be equal to the base emitter voltages of transistors Q1 and Q3. This leads to the biasing arrangement of FIG. 6B.

Figure 7A:
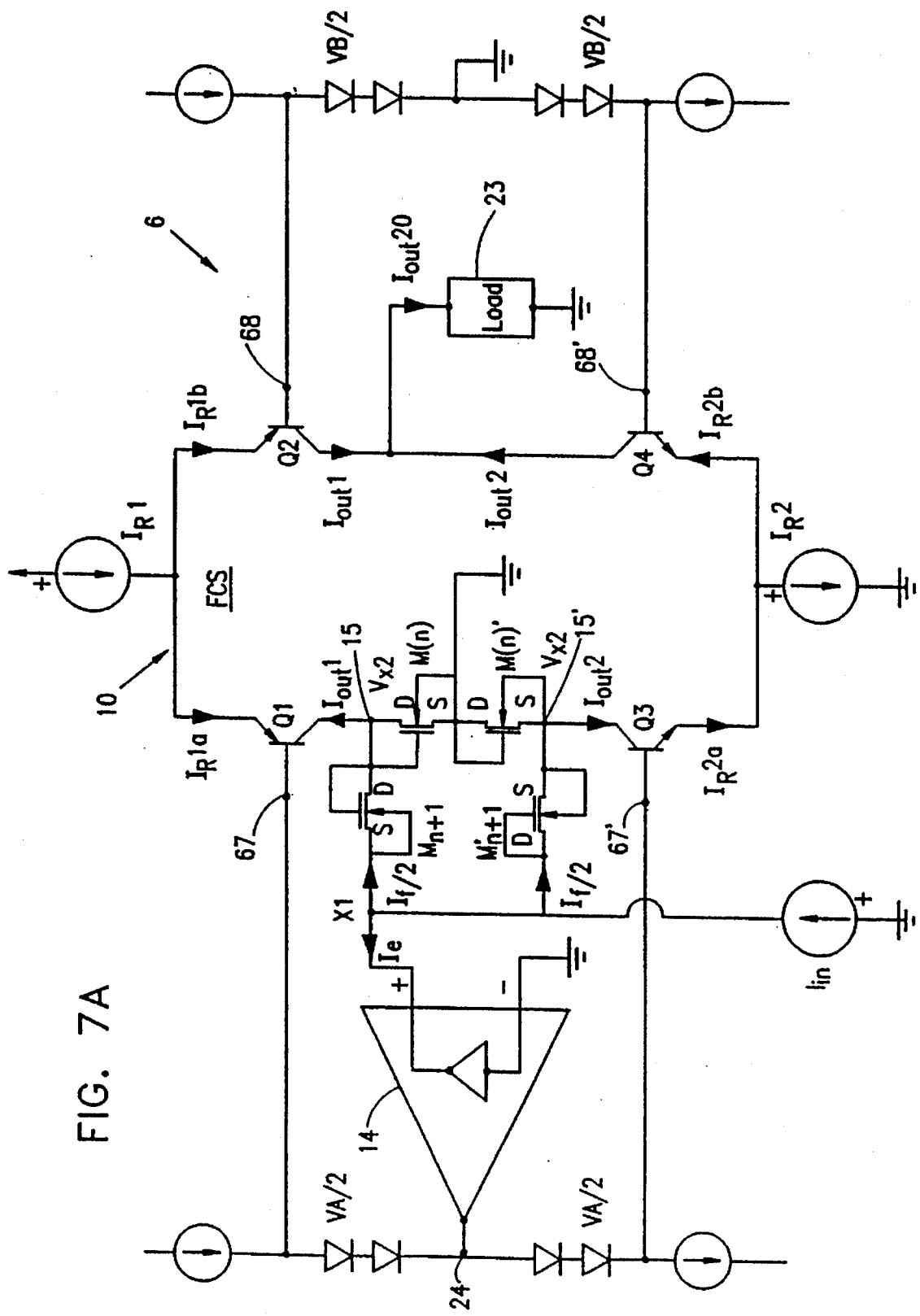
FIG. 7A shows a schematic block diagram of a CMFA which employs an FCS as a COS and comprises a feedback network consisting of two unidirectional branches, each branch consisting of n+1 unipolar N-channel MOS-FETs operating in the saturated region, in accordance with a preferred embodiment of the invention.
Figure 7B:
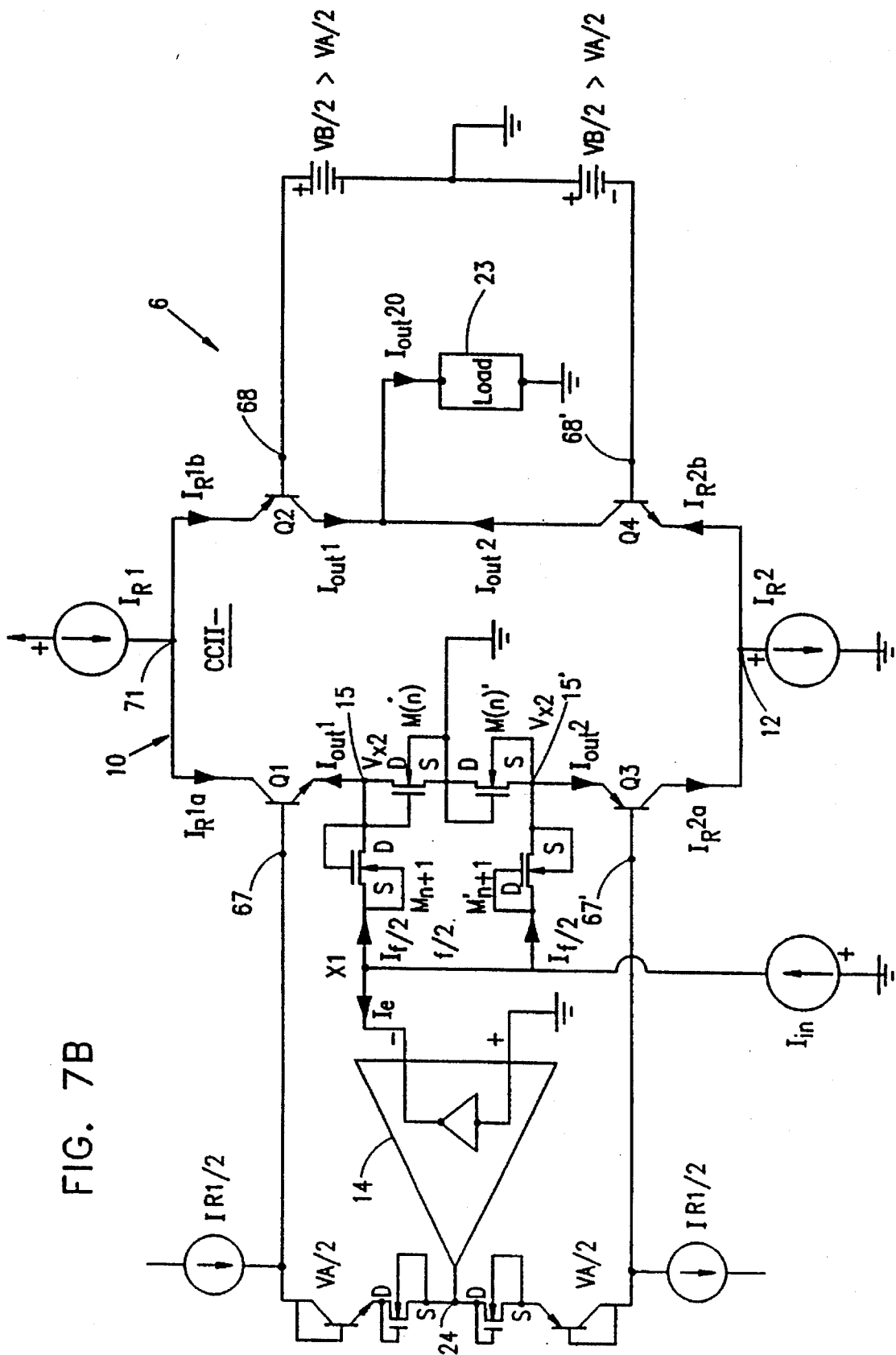
FIG. 7B is a schematic block diagram of a CMFA using a CCII- as a COS and comprising a feedback network such as shown in FIG. 7A, in accordance with a preferred embodiment of the invention.

FIGS. 7A and 7B show alternative configurations of CMFA 6, each configuration comprising a feedback network which consists of two unidirectional branches, each branch comprising unipolar N-channel MOS-FETs, according to preferred embodiments of the invention.

According to alternative preferred embodiments of the invention, at least one unidirectional branch of the feedback network employs unipolar P-channel MOS-FETs as non-linear elements $M_1$ to $M_{n+1}$ or $M'_1$ to $M'_{n+1}$, respectively.

FIG. 7A shows a configuration of CMFA 6 in which the Drain and the Gate terminals of each of N-channel MOS-FETs $M_1$ to $M_{n+1}$ and $M'_1$ to $M'_{n+1}$ comprised in the two branches of the feedback network are interconnected to ensure the operation of the MOS-FETs in the pinched-off region. In the pinched-off region and in the triode region, the MOS-FET behaves as a non-linear resistance whose value equals $1/g_m$, where $g_m$ is the channel conductance. However, in the pinched-off region, unlike in the triode region, the connection between the Gate and the Drain terminals turns the MOS-FET from a bipolar element into a unipolar element in which the Drain current can never reverse polarity, since the Drain current cuts off if $V_{GS} \leq V_{TH}$. Hence, in order to prevent the current flowing through the feedback network from ever becoming zero, the feedback network consists of two unidirectional branches, one for each current direction. These branches are driven by a modified FCS which is employed as COS 10 in a mode which distinguishes the present invention over prior art.

Voltages $V_{x2}$ and $V_{x2}'$ appear at the collector terminals of transistors Q1 and Q3 separately, at input nodes 15 and 15', respectively. It follows that in absence of a signal $I_{in}$ a DC current which equals $0.5I_R1$ flows through the upper branch of the feedback network, and a DC current which equals $0.5I_R2$ flows in the opposite direction through the lower branch of the feedback network. The currents which flow through the two branches are assumed to be equal although in practice they will be slightly different.

In order to facilitate recognition of corresponding transistors, nodes and voltages, those belonging to the lower branch of the feedback network will be labeled by identical but primed numbers and symbols as of the upper branch. Each of the two branches comprises n+1 N-channel MOS-FETs.

Q1 of the FCS feeds MOS-FETs $M_1$ to $M_{n+1}$, where MOS-FET $M_{n+1}$ replaces $R_f$ 2 shown in FIG. 2, and MOS-FETs $M_1$ to $M_n$, connected in parallel and labeled collectively as M(n), replace $R_o$ 3 shown in FIG. 2. Q3 feeds MOS-FETs $M'_1$ to $M'_{n+1}$, where MOS-FETs $M'_1$ to $M'_n$ are labeled collectively as M'(n) and are connected in parallel. This ensures, that the current feeding each branch varies between $|0.25I_R|$ and $|0.75I_R|$ over the full range of $-0.5I_R \leq I_{out}20 \leq 0.5I_R$, and that the value of $V_{GS}$ is always greater than that of $V_{TH}$ for each MOS-FET. The Source of each MOS-FET comprised in the feedback network is labeled S, and the Drain is labeled D.

FIG. 7B shows a configuration of CMFA 6 comprising a feedback network such as in FIG. 7A and a modified CCII- employed as COS 10. The feedback network is driven by a modified CCII- in a mode which distinguishes the present invention over prior art. Unlike the configuration shown in FIG. 7A which employs an FCS as COS 10, transistor Q1 of the CCII- is an NPN-type and transistor Q3 is a PNP-type. Hence transistors Q1 and Q3 act like emitter followers and drive the feedback network from a low impedance. In a conventional CCII- as described in the paper by Arbel and Goldminz, op.cit., the emitter terminals of Q1 and Q3 are interconnected. In the configuration shown in FIG. 7B, Q1 drives the upper branch and Q3 drives the lower branch of the feedback network, respectively. Transistors Q1 with Q2 and Q3 with Q4 still form a folded cascode, as in FIG. 6B. The resulting signal currents $I_{out}1$ and $I_{out}2$ equal the corresponding currents in the configuration shown for FIG. 7A.

The limitations on VA/2 and VB/2 for the circuits of FIGS. 7A and 7B are similar to those for FIGS. 6A and 6B respectively, leading to the circuitry for generating these voltages shown in FIGS. 7A and 7B.

According to preferred embodiments of the invention, the feedback networks shown in FIGS. 4, 6 and 7 are comprised in configurations of a differential CMFA 7, such as described in the paper "Feasibility Study of Current Mode Differential Amplifier Design", Lavy Goldminz and Arie Arbel, Proceedings ISCAS 1992, San Diego, pp. 2856–2859. Such a differential CMFA comprises essentially two assemblies, each assembly comprising a single ended amplifier such as shown in any of the FIGS. 4, 6 and 7.

Figure 8A:
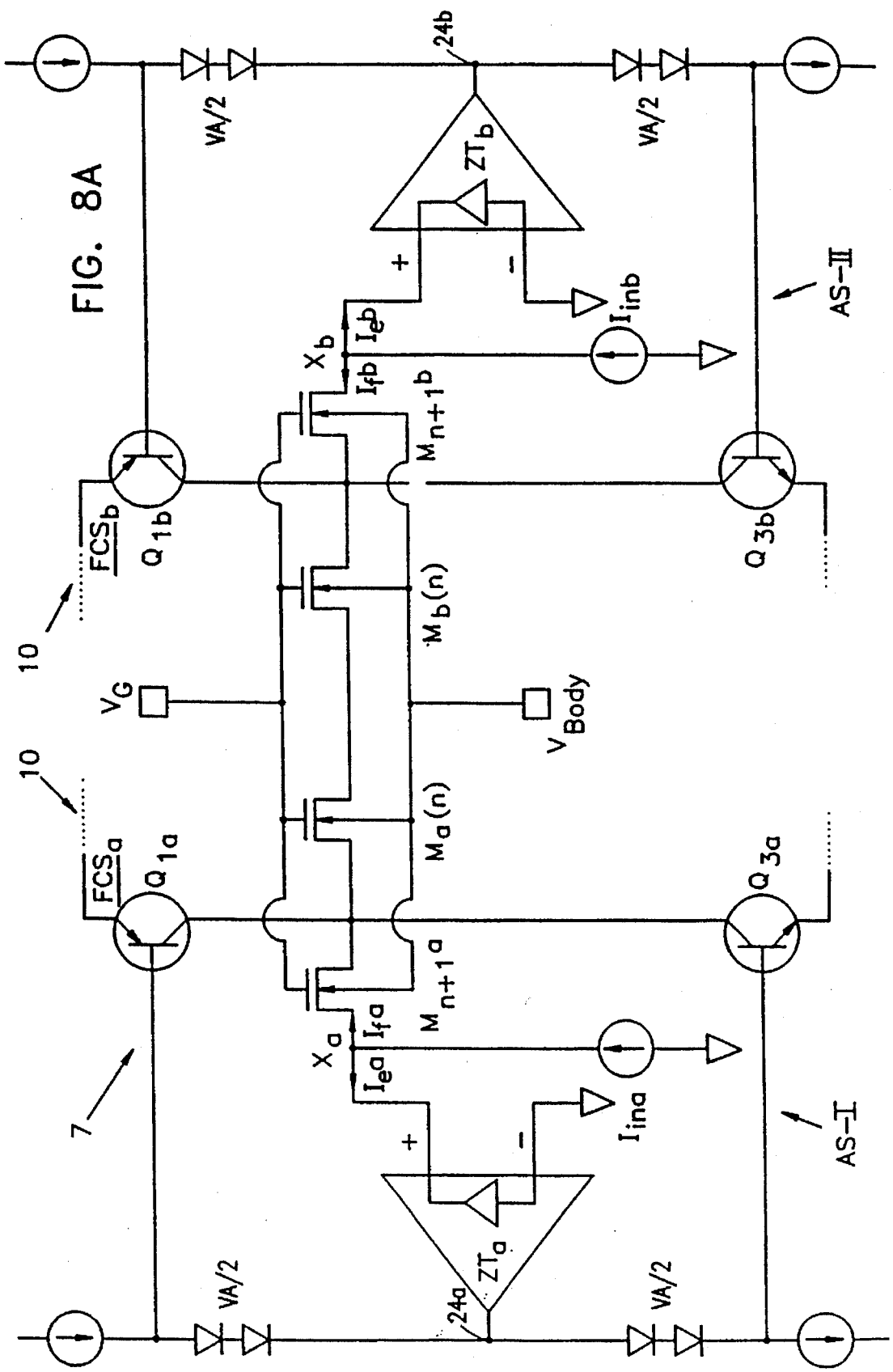
FIG. 8A shows a configuration of a differential CMFA consisting of two assemblies, each assembly comprising a bidirectional feedback network such as shown in FIG. 6 and employing an FCS as a COS, in accordance with a preferred embodiment of the invention.
Figure 8B:
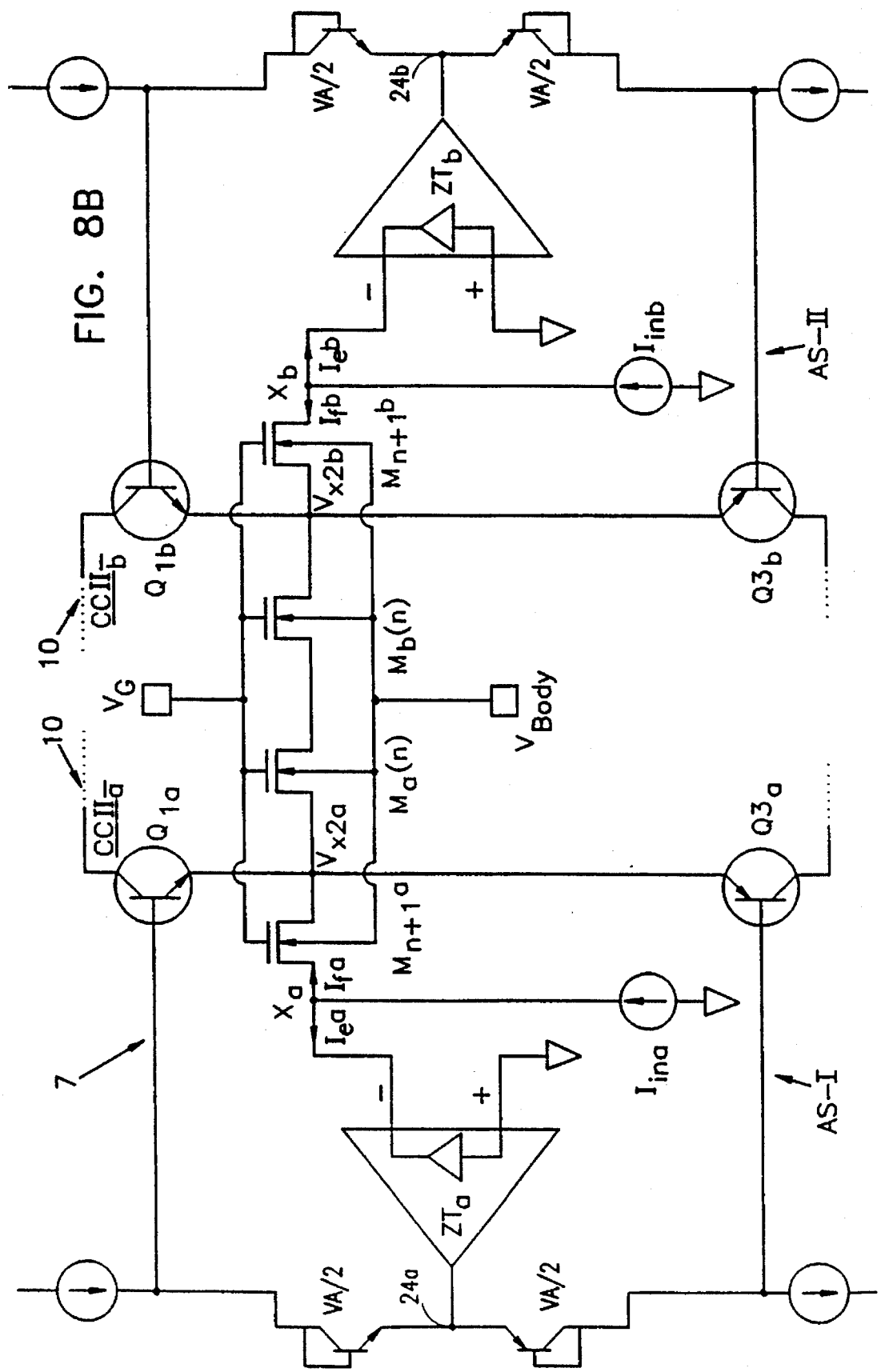
FIG. 8B shows a configuration of a differential CMFA consisting of two assemblies, each assembly comprising a bidirectional feedback network such as shown in FIG. 6 and employing a CCII- as a COS, in accordance with a preferred embodiment of the invention.

FIGS. 8A and 8B show configurations of a differential CMFA 7 according to preferred embodiments of the invention. FIG. 8A shows a configuration comprising two assemblies AS-I and AS-II, each assembly comprising a configuration of CMFA 6, such as shown in FIG. 6A, where it is employed as a single ended amplifier. Assemblies AS-I and AS-II are substantially identical. The elements comprised in assembly AS-I are labeled as in FIG. 6A with an addition of "a", and the corresponding elements comprised in assembly AS-II are labeled with an addition of "b". Each of assemblies AS-I and AS-II can employ either an FCS or a CCII- as COS 10, as shown in FIGS. 8A and 8B, respectively, and as is the case for the configurations of CMFA 6 shown in FIGS. 6A and 6B, respectively.

FIG. 9A shows a configuration of differential CMFA 7 comprising two assemblies, each assembly comprising an FCS employed as COS 10 and a feedback network consisting of two unidirectional branches, in accordance with a preferred embodiment of the invention. The feedback network comprised in each of assemblies AS-I and AS-II is such as the feedback network comprised in the configuration of CMFA 6 shown in FIG. 7A.

Figure 9B:
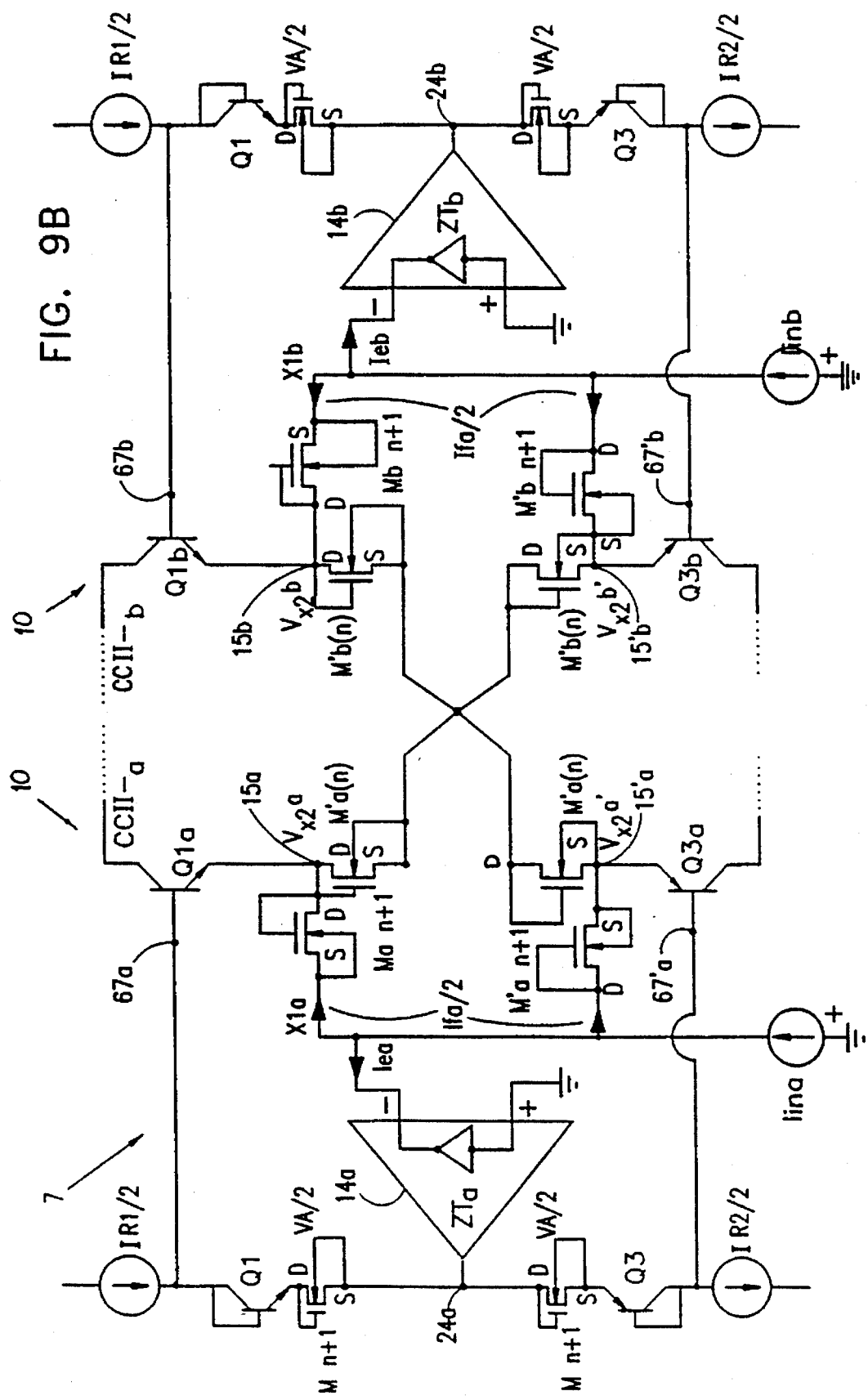
FIG. 9B shows a configuration of a differential CMFA consisting of two assemblies, each assembly comprising a feedback network such as shown in FIG. 7 and employing a CCII- as a COS, in accordance with a preferred embodiment of the invention.

FIG. 9B shows a configuration of differential CMFA 7 which is substantially the same as the configuration shown in FIG. 9A, but employs a CCII- as COS 10, in accordance with a preferred embodiment of the invention. Each branch of the feedback networks comprised in assemblies AS-I and AS-II comprises n+1 substantially identical non-linear elements.

The configurations shown in FIGS. 9A and 9B employ N-channel MOS-FETs as the non-linear elements comprised in each branch of the feedback network of assemblies AS-I and AS-II.

According to preferred embodiments of the invention, CMFA 6, such as shown in FIGS. 4–7, and differential CMFA 7, such as shown in FIGS. 8–9, comprise a feedback network employing P-channel MOS-FETs as the non-linear elements comprised in each branch of the feedback network of assemblies AS-I and AS-II.

In the preferred embodiments described above, the MOS-FETs act as non-linear two-terminal elements having a complex impedance.

According to preferred embodiments of the invention, a feedback network consisting of a plurality of non-linear active elements can be configured to provide a linear current gain or attenuation over a wide range of values.

Figure 10:
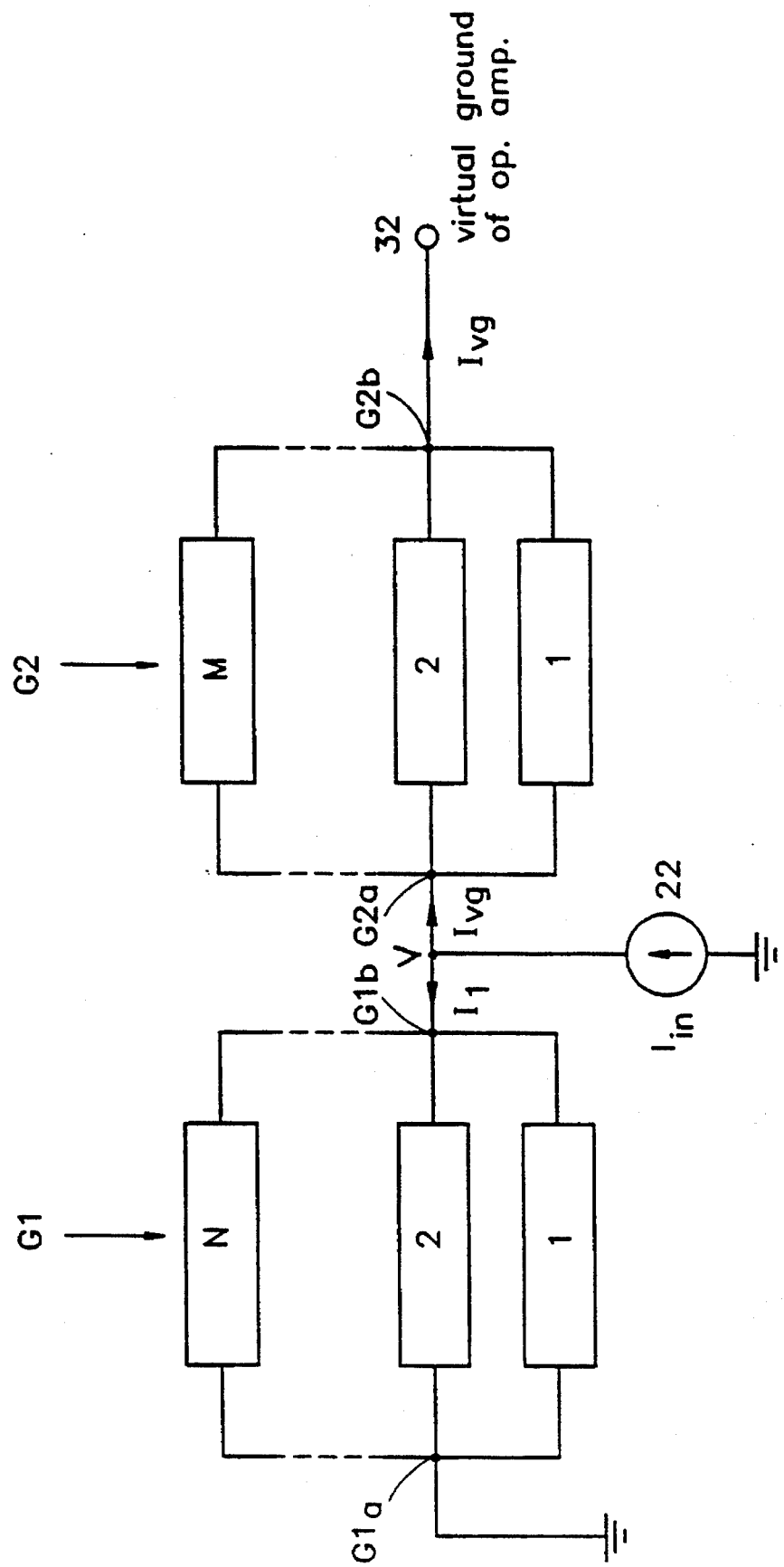
FIG. 10 shows a current attenuating network consisting of two assemblies of non-linear elements, in accordance with a preferred embodiment of the invention.

FIG. 10 shows a current attenuating network which consists of two assemblies of non-linear elements, G1 and G2, in accordance with preferred embodiments of the invention. Assembly G1 comprises N non-linear elements which are connected in parallel to common nodes G1a and G1b, and assembly G2 comprises M non-linear elements which are connected in parallel to common nodes G2a and G2b. The ratio between M and (M+N) determines the value of the current attenuation.

In the configuration shown in FIG. 10, assembly G1 is connected between ground and an input current source 22, and assembly G2 is connected between the input current source and a virtually grounded terminal 32 of a following operational amplifier (not shown). An input current $I_{in}$ is fed into the network from input current source 22. Since the direction of $I_{in}$ 22 is conventionally drawn as flowing into the circuit, $I_{vg}$ is reversed in comparison with FIG. 4C. $I_{in}$ splits into a current $I_1$ flowing into ground and an output current $I_{vg}$ flowing through assembly G2 of the feedback network into terminal 32.

Since the voltage V across the current attenuating network is the same for all non-linear elements, $I_1=V \cdot N \cdot G$ and $I_{vg}=V \cdot M \cdot G$, assuming the conductance G of all non-linear elements is the same at any one time. Hence, $V=I_{in}/(M+N)G$ and $I_{vg}=V \cdot M \cdot G=I_{in} \cdot MG/(M+N)G$. It follows that the attenuation $I_{vg}/I_{in}=M/(M+N)$.

According to preferred embodiments of the invention, the configuration shown in FIG. 10 serves as a stand-alone attenuator, having an attenuation ratio $M/(M+N)$.

Figure 11:
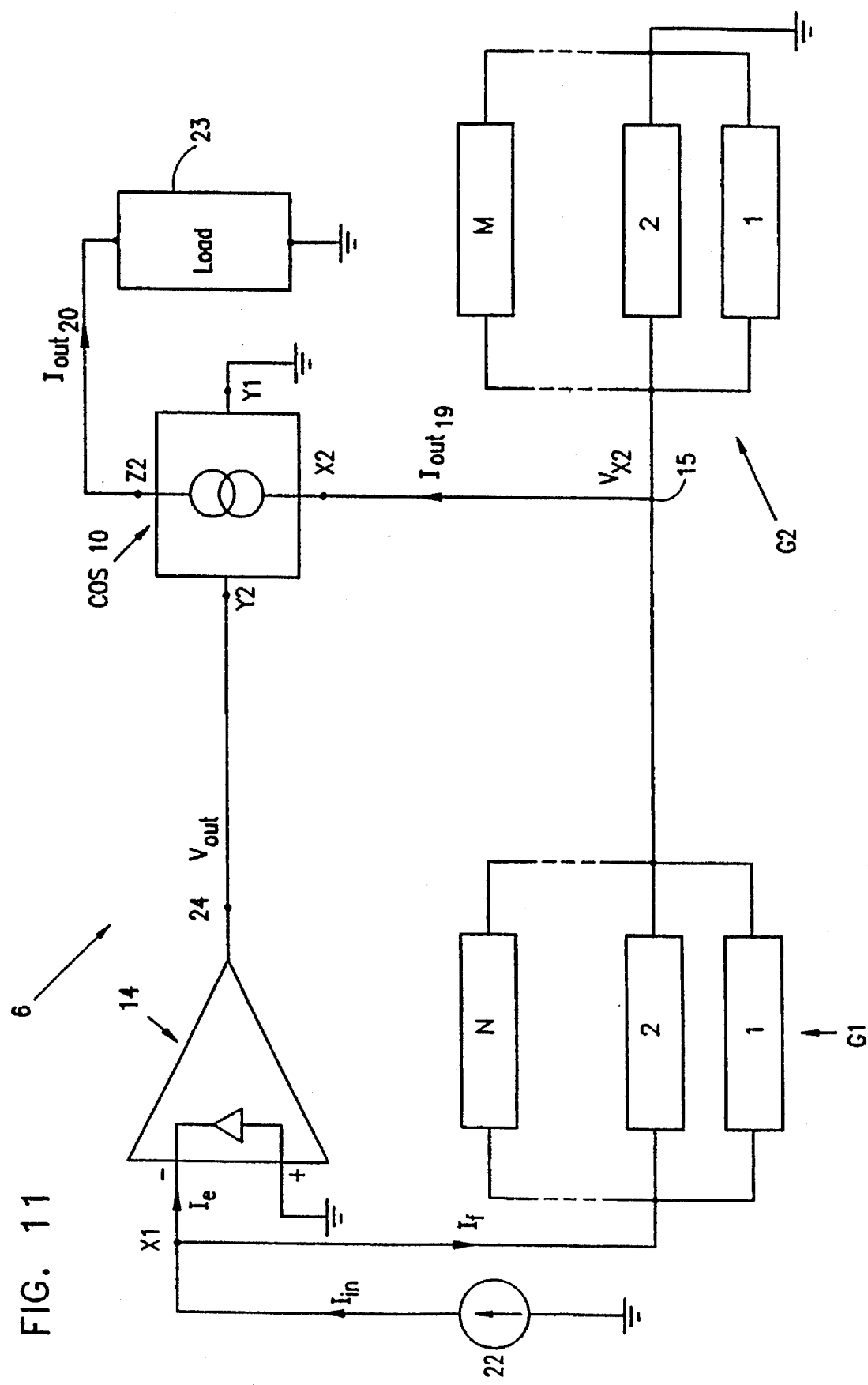
FIG. 11 shows a configuration of a CFMA similar to that of FIG. 4A comprising a feedback network consisting of two assemblies of non-linear elements connected in parallel, in accordance with a preferred embodiment of the invention.

FIG. 11 shows a configuration of CMFA 6 comprising a feedback network which is a modification of the feedback network shown in FIG. 3. Assembly G1, comprising N non-linear elements, replaces non-linear element $M_{n+1}$ which is shown in FIG. 4 and which replaces passive feedback resistor Rf 2 shown in FIG. 2. Assembly G2, comprising M non-linear elements, replaces non-linear elements M1 to Mn which replace passive gain-setting resistor Ro 3 shown in FIG. 2. The current gain obtained by the configuration shown in FIG. 11 equals=1+(M/N). Since M/N≧1, the configuration shown in FIG. 11 provides only a current gain and no current attenuation.

Figure 12:
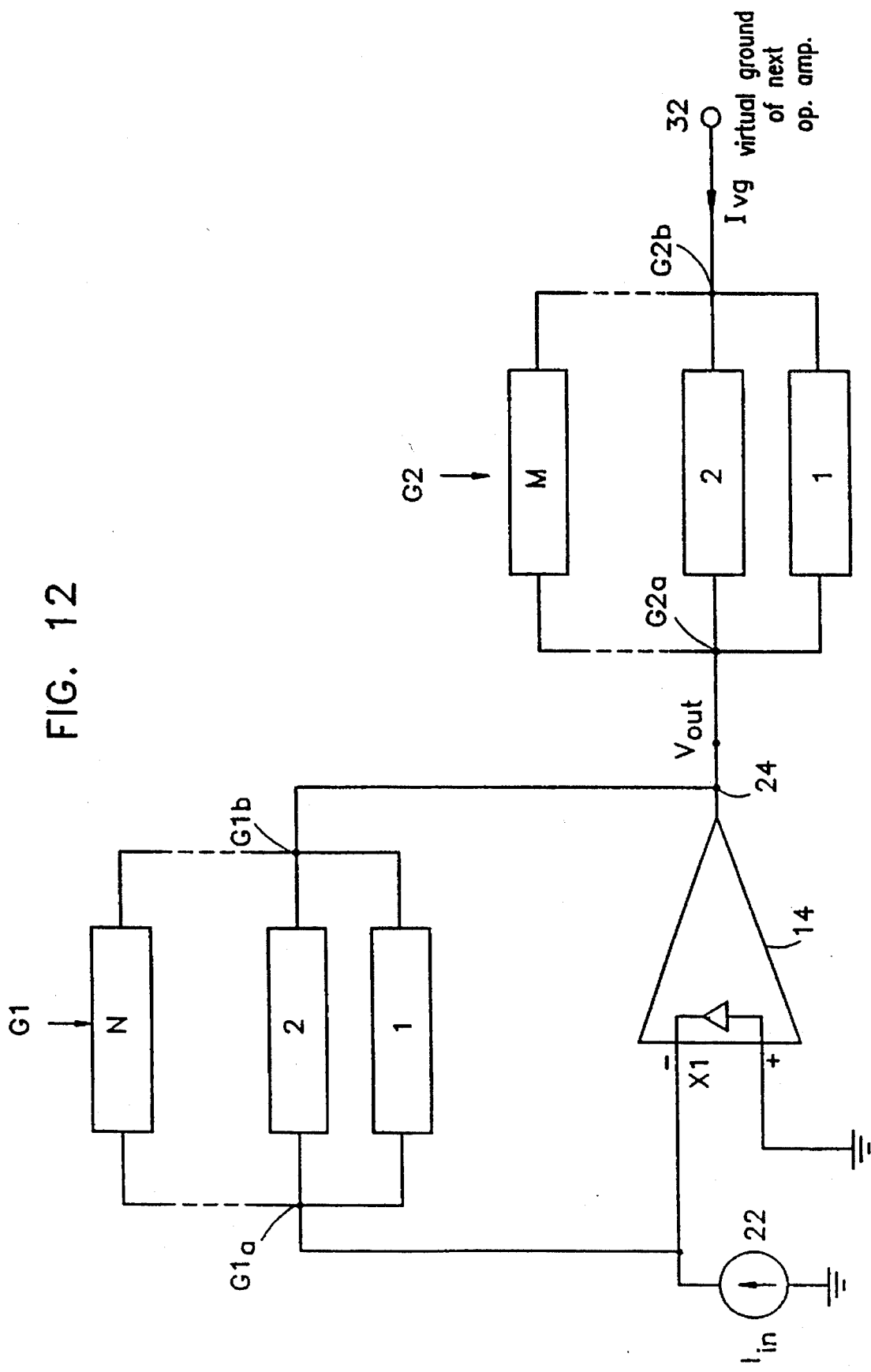
FIGS. 12–13 show configurations which can serve as a CMFA or current attenuator comprising a basic amplifier and a feedback network consisting of two assemblies of non-linear elements connected in parallel, in accordance with preferred embodiments of the invention.

FIG. 12 shows a configuration of an amplifier which comprises a transimpedance operational amplifier 14 and a feedback network comprising assemblies G1 and G2. Assembly G1 is connected in the feedback path of amplifier 14, between inverting input current terminal X1 and output voltage terminal 24. Assembly G2 is connected between output voltage terminal 24 of amplifier 14 and a virtually grounded input current terminal 32 of a following operational amplifier (not shown). An input current $I_{in}$ 22 is connected to terminal X1. An output current $I_{vg}$ flows from assembly G2 into terminal 32 in the direction as shown. The ratio $Iv_g/I_{in}$ obtained by the configuration shown in FIG. 12 equals M/N. Hence, if M>N, the feedback network provides a current gain, while if M<N the feedback network provides a current attenuation. The operational amplifier may also be realized as a voltage operational amplifier.

Figure 13:
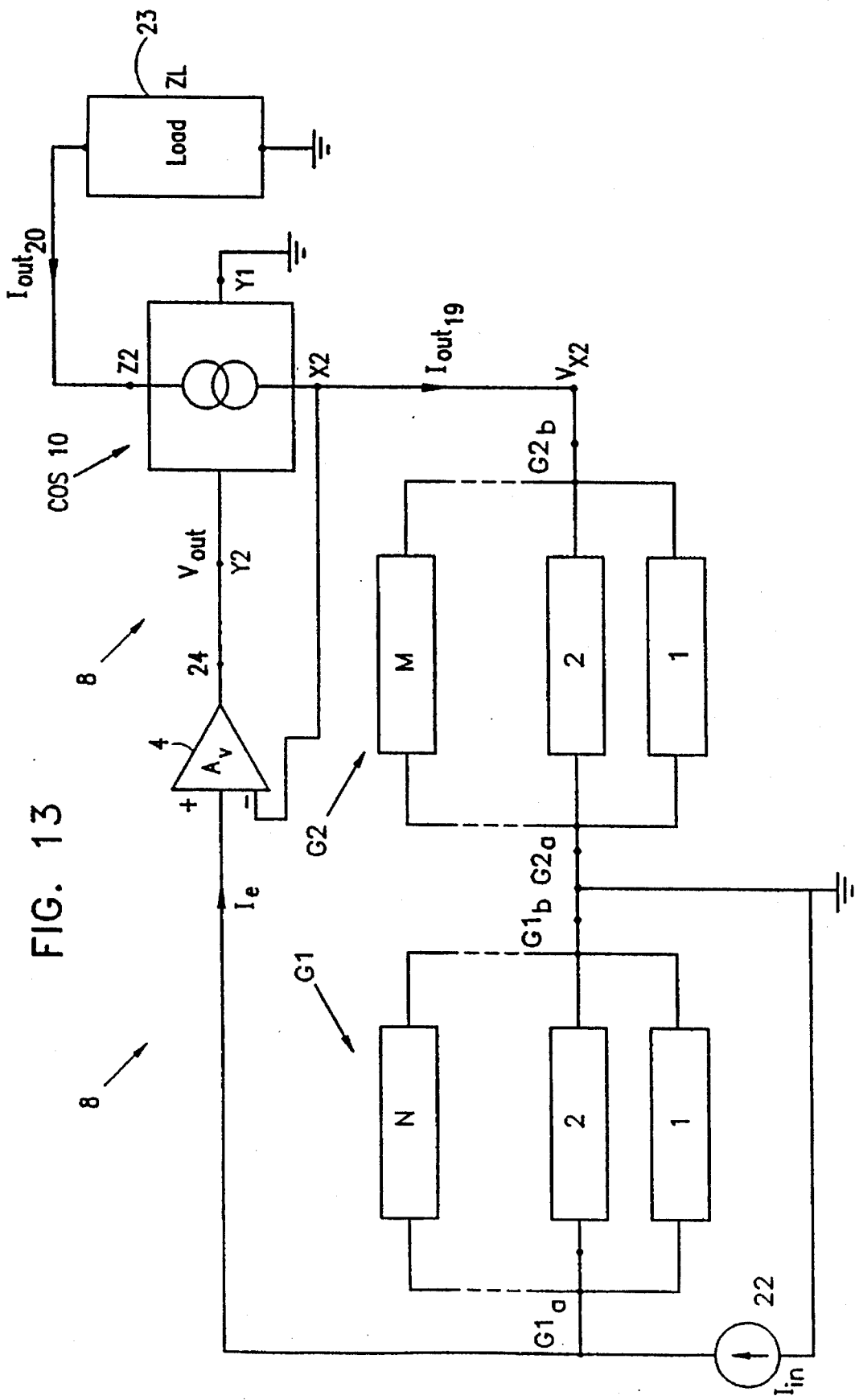

FIG. 13 shows an inverting CMFA, an important current mode building block hitherto unknown in the art. It consists of a stand-alone CCII- connected to two assemblies G1 and G2 similar to those employed in FIGS. 10 to 12. A stand-alone CCII- 8 can be considered to be a CMFA 6 as shown in FIG. 4b, but with transistor Mn+1 short circuited. In this configuration input current Iin 22 is fed from input current source 22 into assembly G1 which is connected between the ground and the input terminal of amplifier 4. Assembly G2 is connected between the ground and current terminal X2 of COS 10 which is realized as a conventional CCII-. The inverting input terminal of amplifier 4 is connected to the current terminal X2 of COS 10, and its output feeds the voltage terminal Y2 of COS 10. The transfer function $I_{out}20/I_{in}22$ obtained by this configuration equals M/N as well. It follows, that (assuming $I_e$ to be negligibly small) $I_{in}$ substantially flows into assembly G1, and that the CCII- 8 acts as a voltage follower making the voltage across the assemblies G1 and G2 equal and injecting the resulting current $I_{out}$ 19 flowing via assembly G2 as $I_{out}$ 20 into the load 23 in the direction as shown. Since the ratio between the currents via G2 and G1 equals M/N, the ratio $I_{out}20/I_{in}22$ obtained by this configuration equals M/N as well. This provides either gain or attenuation depending upon whether M>N or M<N. Note, that the direction of $I_{out}$ 19 and $I_{out}$ 20 is opposite to that obtained in CMFA 6 shown in FIG. 4b, hence this CMFA is inverting.

It will be appreciated by persons skilled in the art, that the present invention is not limited to what has been particularly shown and described hereinabove. Rather the scope of the present invention is defined only by the claims which follow.

I claim:

1. An electronic circuit comprising:

a basic amplifier having an input port and at least one output port;

a network comprising a plurality of substantially electrically identical, non-linear, elements arranged in first and second assemblies, wherein said first assembly comprises at least one of said elements, said second assembly comprises at least one of said elements, wherein the first assembly is connected between the input port and the output port and the second assembly is connected between the output port and a ground or virtual ground other than the input port wherein the number of elements in the first assembly is different from the number of elements in the second assembly.

2. An electronic circuit according to claim 1 wherein said basic amplifier comprises an operational amplifier and a COS output stage, having first and second output ports wherein the first assembly is connected between said first output port and said input port, wherein said second assembly is connected between said first output port and ground.

3. An electronic circuit according to claim 2 and wherein said second output supplies an output current substantially equal to the output current of the first output port and is connected to a load.

4. An electronic circuit according to claim 1 wherein the number of elements in the first assembly is greater than the number of elements in the second assembly, said elements in an assembly being connected in a parallel configuration, whereby the circuit is a current attenuator having a linear transfer function which is substantially independent of frequency.

5. An electronic circuit according to claim 1 wherein the number of elements in the second assembly is greater than the number of elements in the first assembly, said elements in an assembly being connected in a parallel configuration, whereby the circuit is a current amplifier having a linear transfer function which is substantially independent of frequency.

6. An electronic circuit according to claim 1 wherein the ground or virtual ground other than the input is the input to a subsequent operational amplifier.

7. An electronic circuit according to claim 6 wherein the number of elements in the first assembly is greater than the number of elements in the second assembly, said elements in an assembly being connected in a parallel configuration, whereby the circuit is a current attenuator having a linear transfer function which is substantially independent of frequency.

8. An electronic circuit according to claim 6 wherein the number of elements in the second assembly is greater than the number of elements in the first assembly, said elements in an assembly being connected in a parallel configuration, whereby the circuit is a current amplifier having a linear transfer function which is substantially independent of frequency.

9. A circuit according to claim 1 wherein said non-linear elements are MOS-FETS, each MOS-FET having Source, Bulk, Gate and Drain terminals; and wherein said circuit comprises a switching arrangements which is operative to connect said Gate and Bulk terminals of at least one of said MOS-FETS, for providing a coarse transfer function control.

10. A circuit according to claim 1 wherein said non-linear elements are MOS-FETS, each MOS-FET having Source, Bulk, Gate and Drain terminals;

wherein said basic amplifier comprises a first power supply which electrifies said Bulk terminals of said MOS-FETS;

wherein said operational amplifier comprises a second power supply which electrifies said Bulk terminal of at least one of said MOS-FETS; and wherein said operational amplifier comprises a potentiometer which is connected between said first and second power supplies and which varies the voltage applied to said Bulk terminal of at least one of MOS-FETS, for providing a fine transfer function control.

11. A circuit according to claim 1, wherein said non-linear elements are MOS-FETS, each MOS-FET having Source, Bulk, Gate and Drain terminals;

wherein said basic amplifier comprises a power supply which supplies a time-varying voltage; and wherein said power supply electrifies said Bulk terminal of at least one of said MOS-FETS, for providing a time-modulated linear transfer function.

12. A circuit according to claim 1, wherein said non-linear elements are active elements.

13. A circuit according to claim 1, wherein said non-linear elements are MOS-FETs (field effect transistors) operating in a triode mode.

14. An electronic circuit comprising:

an operational amplifier having an input port and at least one output port;

a network comprising a plurality of substantially electrically identical, non-linear, elements arranged in first and second assemblies, wherein said first assembly comprises at least one of said elements, said second assembly comprises at least one of said elements, wherein the first assembly is connected between the input port and ground and wherein the second assembly is connected between the output port and a ground or virtual ground other than the input port.

15. An electronic circuit according to claim 14 and further comprising a COS output stage of said operational amplifier, said output stage having first and second output ports wherein the second assembly is connected between said first output port and said ground or virtual ground other than said input port and wherein said second output port has an output current substantially equal to the output current of the first output port.

16. An electronic circuit according to claim 14 wherein the number of elements in the first assembly is greater than the number of elements in the second assembly, said elements in an assembly being connected in a parallel configuration, whereby the circuit is a current attenuator having a linear transfer function which is substantially independent of frequency.

17. An electronic circuit according to claim 14 wherein the number of elements in the second assembly is equal to or greater than the number of elements in the first assembly, said elements in an assembly being connected in a parallel configuration, whereby the circuit is a current amplifier having a linear transfer function which is substantially independent of frequency.

18. An electronic circuit according to claim 14 wherein the ground or virtual ground other than the input is the input to a subsequent operational amplifier.

19. A circuit according to claim 14 wherein said non-linear elements are MOS-FETS, each MOS-FET having Source, Bulk, Gate and Drain terminals; and wherein said circuit comprises a switching arrangements which is operative to connect said Gate and Bulk terminals of at least one of said MOS-FETS, for providing a coarse transfer function control.

20. A circuit according to claim 14 wherein said non-linear elements are MOS-FETS, each MOS-FET having Source, Bulk, Gate and Drain terminals;

wherein said operational amplifier comprises a first power supply which electrifies said Bulk terminals of said MOS-FETS;

wherein said operational amplifier comprises a second power supply which electrifies said Bulk terminal of at least one of said MOS-FETS; and wherein said operational amplifier comprises a potentiometer which is connected between said first and second power supplies and which varies the voltage applied to said Bulk terminal of at least one of MOS-FETS, for providing a fine transfer function control.

21. A circuit according to claim 14, wherein said non-linear elements are MOS-FETS, each MOS-FET having Source, Bulk, Gate and Drain terminals;

wherein said operational amplifier comprises a power supply which supplies a time-varying voltage; and wherein said power supply electrifies said Bulk terminal of at least one of said MOS-FETS, for providing a time-modulated linear transfer function.

22. A circuit according to claim 14, wherein said non-linear elements are active elements.

23. A circuit according to claim 14, wherein said non-linear elements are MOS-FETs (field effect transistors) operating in a triode mode.

24. An electronic circuit according to claim 14 and including:

switching circuitry which is operative to selectively change the number of elements in at least one of the first and second assemblies.

25. A circuit comprising a current source feeding a current dividing network comprising a plurality, N+M, of substantially identical non-linear elements connected in two parallel connected groups of N and M elements each, wherein one of the parallel groups of elements has one end thereof connected to ground or virtual ground to provide a linear current attenuation of M/(N+M) wherein at least one of N and M are greater than 1.

26. A circuit according to claim 25 wherein said non-linear elements are MOS-FETS, each MOS-FET having Source, Bulk, Gate and Drain terminals; and wherein said circuit comprises a switching arrangements which is operative to connect said Gate and Bulk terminals of at least one of said MOS-FETS, for providing a coarse transfer function control.

27. A circuit according to claim 25 wherein said non-linear elements are MOS-FETS, each MOS-FET having Source, Bulk, Gate and Drain terminals;

wherein said basic amplifier comprises a first power supply which electrifies said Bulk terminals of said MOS-FETS;

wherein said operational amplifier comprises a second power supply which electrifies said Bulk terminal of at least one of said MOS-FETS; and wherein said operational amplifier comprises a potentiometer which is connected between said first and second power supplies and which varies the voltage applied to said Bulk terminal of at least one of MOS-FETS, for providing a fine transfer function control.

28. A circuit according to claim 25, wherein said non-linear elements are MOS-FETS, each MOS-FET having Source, Bulk, Gate and Drain terminals;

wherein said basic amplifier comprises a power supply which supplies a time-varying voltage; and wherein said power supply electrifies said Bulk terminal of at least one of said MOS-FETS, for providing a time-modulated linear transfer function.

29. A circuit according to claim 25, wherein said non-linear elements are active elements.

30. A circuit according to claim 25, wherein said non-linear elements are MOS-FETs (field effect transistors) operating in a triode mode.

31. A circuit according to claim 25 and including:

switching circuitry which is operative to selectively change the number of elements in at least one of the first and second groups.

32. An electronic circuit comprising:

a basic amplifier; and a feedback network consisting substantially of a plurality, N+M, of substantially identical non-linear elements connected in parallel in two groups of N and M elements each, to provide a linear feedback stabilized gain of 1+(M/N) at least one of the parallel groups being connected between an output of the basic amplifier and a ground or virtual ground.

33. An electronic circuit according to claim 32 wherein the basic amplifier comprises an operational amplifier.

34. A circuit according to claim 33 wherein one of N or M is one and the other of N or M is at least 1.

35. A circuit according to claim 33 wherein both N and M are greater than 1.

36. A circuit according to claim 15 wherein one of N or M is one and the other of N or M is are at least 1.

37. A circuit according to claim 32 wherein both N and M are greater than 1.

38. A circuit according to claim 32 wherein said non-linear elements are MOS-FETS, each MOS-FET having Source, Bulk, Gate and Drain terminals; and wherein said circuit comprises a switching arrangements which is operative to connect said Gate and Bulk terminals of at least one of said MOS-FETS, for providing a coarse transfer function control.

39. A circuit according to claim 32 wherein said non-linear elements are MOS-FETS, each MOS-FET having Source, Bulk, Gate and Drain terminals;

wherein said basic amplifier comprises a first power supply which electrifies said Bulk terminals of said MOS-FETS;

wherein said operational amplifier comprises a second power supply which electrifies said Bulk terminal of at least one of said MOS-FETS; and wherein said operational amplifier comprises a potentiometer which is connected between said first and second power supplies and which varies the voltage applied to said Bulk terminal of at least one of MOS-FETS, for providing a fine transfer function control.

40. A circuit according to claim 32, wherein said non-linear elements are MOS-FETS, each MOS-FET having Source, Bulk, Gate and Drain terminals;

wherein said operational amplifier comprises a power supply which supplies a time-varying voltage; and wherein said power supply electrifies said Bulk terminal of at least one of said MOS-FETS, for providing a time-modulated linear transfer function.

41. A circuit according to claim 32, wherein said non-linear elements are active elements.

42. A circuit according to claim 32, wherein said non-linear elements are MOS-FETs (field effect transistors) operating in a triode mode.

43. An electronic circuit according to claim 32 and including:

switching circuitry which is operative to selectively change the number of elements in at least one of the first and second groups.

44. An electronic circuit comprising:

a basic amplifier having an input port which is a virtual ground; and a stabilizing network consisting substantially of a plurality, N+M, of substantially identical non-linear elements connected in parallel in two groups of N and M elements each, wherein N is different from M and wherein at least one of the parallel groups being connected between an output of the basic amplifier and a ground or virtual ground, to provide a linear feedback stabilized gain or attenuation of (M/N).

45. An electronic circuit according to claim 44 wherein the basic amplifier comprises an operational amplifier and a COS output stage, having first and second output ports, wherein:

said first output port is connected to the input port;

one of said groups of elements is connected between said first output port and ground;

the second of said groups is connected between ground and said input port; and the second output port is connected to a load.

46. A circuit according to claim 44 wherein said non-linear elements are MOS-FETS, each MOS-FET having Source, Bulk, Gate and Drain terminals; and wherein said circuit comprises a switching arrangements which is operative to connect said Gate and Bulk terminals of at least one of said MOS-FETS, for providing a coarse transfer function control.

47. A circuit according to claim 44 wherein said non-linear elements are MOS-FETS, each MOS-FET having Source, Bulk, Gate and Drain terminals;

wherein said basic amplifier comprises a first power supply which electrifies said Bulk terminals of said MOS-FETS;

wherein said operational amplifier comprises a second power supply which electrifies said Bulk terminal of at least one of said MOS-FETS; and wherein said operational amplifier comprises a potentiometer which is connected between said first and second power supplies and which varies the voltage applied to said Bulk terminal of at least one of MOS-FETS, for providing a fine transfer function control.

48. A circuit according to claim 44, wherein said non-linear elements are MOS-FETS, each MOS-FET having Source, Bulk, Gate and Drain terminals;

wherein said basic amplifier comprises a power supply which supplies a time-varying voltage; and wherein said power supply electrifies said Bulk terminal of at least one of said MOS-FETS, for providing a time-modulated linear transfer function.

49. A circuit according to claim 44, wherein said non-linear elements are active elements.

50. An electronic circuit according to claim 44 and including:

switching circuitry which is operative to selectively change the number of elements in at least one of the first and second groups.

51. An electronic circuit comprising:

a basic amplifier having an input port and at least one output port;

a network comprising a plurality of substantially electrically identical, non-linear, elements arranged in first and second assemblies, wherein said first assembly comprises at least one of said elements, said second assembly comprises at least one of said elements, wherein the first assembly is connected between the input port and the output port and the second assembly is connected between the output port and a ground or virtual ground other than the input port;

switching circuitry which is operative to selectively and reversibly change the number of elements in at least one of the first and second assemblies.

52. A feedback network for use with a suitable basic amplifier, said feedback network substantially consisting of a plurality, n+1, of identical non-linear devices, n of which are in parallel, to provide a linear feedback stabilized gain of n+1 and switching circuitry operative to selectively and reversibly change the number of elements which are in parallel.

53. A feedback network for use with a suitable basic amplifier, said feedback network substantially consisting of a plurality, n+1, of identical non-linear devices, n of which are in parallel, to provide a gain of n+1 which is substantially independent of frequency and switching circuitry operative to selectively and reversibly change the number of elements which are in parallel.

* * * * *